(12) United States Patent
Shimizu et al.

(10) Patent No.: US 6,359,321 B2
(45) Date of Patent: *Mar. 19, 2002

(54) MIS TRANSISTOR AND METHOD OF FABRICATING THE SAME

(75) Inventors: Satoshi Shimizu; Hidekazu Oda, both of Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/874,410

(22) Filed: Jun. 13, 1997

(30) Foreign Application Priority Data

Feb. 4, 1997 (JP) .............................. 9-021531

(51) Int. Cl.[7] .......................... H01L 29/76; H01L 29/94; H01L 31/062; H01L 31/113; H01L 31/119; H01L 27/088

(52) U.S. Cl. ..................... 257/412; 257/900; 257/382; 257/408

(58) Field of Search ................................ 257/379, 900, 257/382–412; 438/300, 301, 302, 303, 297, 594, 260, 682, 592, 163, 664, 571

(56) References Cited

U.S. PATENT DOCUMENTS

| | | | | | |
|---|---|---|---|---|---|
| 4,587,710 A | * | 5/1986 | Tsao | .......................... | 438/571 |
| 4,616,401 A | * | 10/1986 | Takeuchi | .................... | 438/297 |
| 4,774,202 A | * | 9/1988 | Pan et al. | ................... | 438/260 |
| 4,868,617 A | * | 9/1989 | Chao et al. | ................. | 257/900 |
| 5,015,598 A | * | 5/1991 | Venhaar | ....................... | 257/408 |
| 5,017,505 A | * | 5/1991 | Fujii et al. | .................. | 438/594 |
| 5,021,353 A | | 6/1991 | Lowrey et al. | | |
| 5,087,583 A | * | 2/1992 | Hazani | ........................ | 438/594 |
| 5,102,816 A | | 4/1992 | Manukonda et al. | | |
| 5,168,072 A | * | 12/1992 | Moslehi | ....................... | 438/300 |
| 5,391,906 A | * | 2/1995 | Natsume | ...................... | 257/379 |
| 5,491,099 A | | 2/1996 | Hsu | | |
| 5,498,558 A | * | 3/1996 | Kapoor | ......................... | 438/260 |
| 5,518,960 A | | 5/1996 | Tsuchimoto | | |
| 5,554,566 A | * | 9/1996 | Lur et al. | .................... | 438/592 |
| 5,554,871 A | | 9/1996 | Yamashita et al. | | |
| 5,620,912 A | * | 4/1997 | Hwang et al. | .............. | 438/301 |
| 5,656,519 A | * | 8/1997 | Mogami | ..................... | 438/303 |
| 5,702,986 A | * | 12/1997 | Mathews et al. | .......... | 438/163 |
| 5,739,573 A | * | 4/1998 | Kawaguchi | .................. | 257/383 |
| 5,770,507 A | * | 6/1998 | Chen et al. | ................. | 438/664 |
| 5,783,475 A | * | 7/1998 | Ramaswami | ................ | 438/303 |
| 5,783,479 A | * | 7/1998 | Lin et al. | .................... | 438/592 |
| 5,783,486 A | * | 7/1998 | Tseng | ......................... | 438/682 |

FOREIGN PATENT DOCUMENTS

| | | |
|---|---|---|
| JP | 63-318779 | 12/1988 |
| JP | 3-288443 | 12/1991 |
| JP | 5-47785 | 2/1993 |
| JP | 6-13402 | 1/1994 |
| JP | 6-326122 | 11/1994 |
| JP | 7-106280 | 4/1995 |
| JP | 8-255766 | 10/1996 |
| JP | 9-8292 | 1/1997 |

* cited by examiner

*Primary Examiner*—Tom Thomas
*Assistant Examiner*—Cuong Quang Nguyen
(74) *Attorney, Agent, or Firm*—Oblon, Spivak, McClelland, Maier & Neustadt, P.C.

(57) ABSTRACT

Grooves are formed in side walls to be adjacent to a gate electrode. Thereafter a silicide film is formed on a surface of the gate electrode. Thus, the gate electrode is prevented from electrical connection with a source/drain layer resulting from formation of silicide films on surfaces thereof, and its resistance value is prevented from being increased by the silicide films hardly causing phase transition following refinement.

4 Claims, 25 Drawing Sheets

MIS TRANSISTOR AND METHOD OF FABRICATING THE SAME

BACKGROUND OF THE INVENTION

1. Field of the Invention

The present invention relates to a MIS transistor widely employed for an electronic circuit such as a semiconductor integrated circuit and a method of fabricating the same, and more particularly, it relates to a method of fabricating a MIS transistor through a salicide process employing a refractory metal silicide film for attaining a high speed and high reliability.

2. Description of the Background Art

An exemplary salicide (self-aligned silicide) process for forming a general refractory silicide film is described with reference to FIGS. 47 to 50.

First, a well $1a$, isolation oxide films 2, and an impurity layer 3 for controlling a threshold voltage are formed on a silicon substrate 1. Thereafter a silicon oxide film 4 of 6.5 nm in thickness, for example, is formed on the silicon substrate 1, and a polycrystalline silicon layer for defining a gate electrode is deposited on the oxide film 4 in a thickness of 200 nm. An impurity is added to this polycrystalline silicon layer, which in turn is patterned by a photolithographic step and thereafter anisotropically etched for forming a gate electrode 5.

Then, LDD (lightly doped drain) layers 6 which are also referred to as extension layers are formed, and thereafter an oxide film is deposited by CVD (chemical vapor deposition). This oxide film is etched back by reactive ion etching (hereinafter referred to as RIE), for forming side walls 7 consisting of silicon oxide on right and left sides of the gate electrode 5.

Then, high-concentration source/drain layers 8 are formed by high-concentration ion implantation, and thereafter heat treatment is performed for activation. FIG. 47 is a sectional view showing a state after completion of the activation.

Then, the salicide process is carried out.

In the salicide process, a surface of the silicon substrate 1 is first cleaned by proper pretreatment, and thereafter a metal film 9 is deposited on the structure shown in FIG. 47 (see FIG. 48).

Then, this structure is heated under a proper atmosphere for forming silicide films 10 by the silicon substrate 1 and the polycrystalline silicon forming the gate electrode 5 (see FIG. 49). The composition of these silicide films 10 is expressed as MSix, assuming that M represents a metal element forming the metal film 9, for example, where x represents the ratio of silicon atoms to the metal atoms. In this case, a short-time heat treatment (rapid thermal annealing) is generally performed through a lamp annealing furnace. The heat treatment which is performed through the lamp annealing furnace immediately after deposition of the metal film 9 is hereafter referred to as first RTA.

At this time, no silicide reaction takes place on upper portions of the isolation oxide films 2 and the side walls 7 due to absence of silicon, and the unreacted metal film 9 remains at least on these upper portions (see FIG. 49). Then, the metal film 9 still containing the unreacted metal M etc. is selectively removed while leaving the silicide films 10 formed by the reacted silicide MSix (see FIG. 50). Basically, the salicide process is ended in the aforementioned step.

However, when the silicide films formed through the aforementioned process are made of titanium silicide TiSix, for example, further heat treatment is performed at a high temperature or over a long time for forming titanium silicide films of $TiSi_2$ having a different composition or structure, since the electric properties of titanium silicide TiSix are insufficient. Also in case of changing the composition or structure of titanium silicide, a short-time heat treatment is generally performed through a lamp annealing furnace. The short-time heat treatment employed for changing the composition or structure of such silicide films is hereinafter referred to as second RTA. Due to the salicide process employing the aforementioned steps, an electrode can advantageously be formed selectively only on a region exposing a silicon surface on the silicon substrate 1.

In recent years, on the other hand, integrated circuits including MIS transistors are implemented with higher density of integration such that the gate length of a planar MOS transistor which is a kind of MIS transistor is refined and side wall widths are also refined in response thereto, for example. However, the conventional MIS transistor fabricated through the salicide process has the aforementioned structure and the silicide film formed on the gate electrode further grows onto the side walls. Due to the small gate length, therefore, the silicide film growing from the gate electrode is disadvantageously connected with those on the source/drain layers if things come to the worst, to result in short-circuiting across the gate electrode and the source/drain layers and deterioration of the yield. FIG. 51 is a sectional view showing a region AR1, enclosed with dotted lines in FIG. 50, in an enlarged manner for illustrating extreme growth of the silicide film. If the diffusion species employed for forming the silicide films is prepared from silicon, short-circuiting is readily caused by creeping of silicide in case of titanium silicide $TiSi_2$, for example.

Due to the aforementioned structure of the conventional MIS transistor fabricated through the salicide process, further, phase transition from a C49 phase to a C54 phase hardly takes place in the crystal structure even by second RTA in case of titanium silicide $TiSi_2$ when the gate length or a silicide wiring width is refined to below 0.5 $\mu$m, resulting in such a problem that the sheet resistance of the titanium silicide films is abruptly increased. FIG. 52 shows exemplary gate dependency of gate resistance in titanium silicide $TiSi_2$.

SUMMARY OF THE INVENTION

According to a first aspect of the present invention, a method of fabricating a MIS transistor includes a gate electrode forming step of forming a gate electrode containing polycrystalline silicon which is opposed to a silicon substrate through a gate insulating film, a side wall forming step of forming side walls on both sides of the gate electrode, and a salicide step of forming desired silicide films on upper portions of the gate electrode and a source/drain layer, and the side wall forming step has steps of depositing a first insulating film on a region including at least one of the both sides of the gate electrode and a surface of the silicon substrate which is allowed to be exposed by the gate electrode and in contact with the at least one of said both sides, depositing a second insulating film which is opposed to the at least one of said both sides and the surface through the first insulating film, and etching back the first and second insulating films thereby forming the at least one of the both sides walls of a two-layer structure, and the method further includes an etching step of etching the first insulating film in a larger amount than the second insulating film before the salicide step.

According to a second aspect of the present invention, compositions of the first and second insulating films are different from each other, and the etching step is adapted to isotropically etch the first insulating film.

According to a third aspect of the present invention, compositions of the first and second insulating films are different from each other, and the etching step is adapted to etch the first insulating film through anisotropic etching at a higher etching rate in a vertical direction which is perpendicular to the silicon substrate as compared with an etching rate in a horizontal width direction.

According to a fourth aspect of the present invention, the method further includes a step of roughening an upper surface of the gate electrode before the salicide step.

The present invention is also directed to a MIS transistor. According to a fifth aspect of the present invention, a MIS transistor includes a gate electrode which is formed to be opposed to a silicon substrate through a gate insulating film and has a silicified upper portion, and side walls which are formed on the silicon substrate on both sides of the gate electrode and have grooves adjacent to the gate electrode, and the gate electrode is silicified up to walls of the gate electrode in the grooves.

According to a sixth aspect of the present invention, the side walls have cavities exposing a source/drain layer which is formed on the silicon substrate.

According to a seventh aspect of the present invention a surface of the gate electrode is roughened.

According to an eighth aspect of the present invention, a MIS transistor includes a gate electrode which is formed to be opposed to a silicon substrate through a gate insulating film and has a silicified upper portion, and side walls which are formed on the silicon substrate on both sides of the gate electrode so that the side walls are higher than the gate electrode, and the side walls are provided with silicon films on walls closer to the gate electrode to be connected with the gate electrode, while a surface of the gate electrode is silicified up to surfaces of the silicon films.

According to a ninth aspect of the present invention, both of the surfaces of the gate electrode and the silicon films are roughened.

According to a tenth aspect of the present invention, a MIS transistor includes a gate electrode which is formed to be opposed to a silicon substrate through a gate insulating film and has a silicified upper portion, and side walls having L-shaped sections which are formed on the silicon substrate on both sides of the gate electrode so that the side walls are higher than the gate electrode.

According to an eleventh aspect of the present invention, a surface of the gate electrode is roughened.

In the method of fabricating a MIS transistor according to the first aspect of the present invention, the grooves can be formed in the side walls of the two-layer structure before the salicide step for increasing the distance between the surfaces of the gate electrode and the source/drain layer, whereby it is possible to effectively prevent short-circuiting across the gate electrode and the source/drain layer caused by silicide creeping along the surfaces of the side walls in formation of the silicide films. Further, the exposed portion of the gate electrode or the source/drain layer is increased due to the grooves formed in the side walls and the width of the silicide film formed on the gate electrode or the source/drain layer can be substantially increased, whereby phase transition of silicide is effectively simplified for reducing gate resistance.

In the method of fabricating a MIS transistor according to the second aspect of the present invention, both of the grooves adjacent to the gate electrode and those (cavities) adjacent to the silicon substrate can be simultaneously formed before the salicide step for improving the effect of preventing short-circuiting caused by silicide creeping along the side wall surfaces, and an effect of readily causing phase transition and reducing resistance can be attained by both silicide films provided on the gate electrode and the source/drain layer.

In the method of fabricating a MIS transistor according to the third aspect of the present invention, the grooves adjacent to the gate electrode can be formed in the side walls by anisotropic etching before the salicide step while no grooves are formed in portions of the side walls which are in contact with the silicon substrate, whereby the grooves can be simply formed when no grooves are to be formed in the portions which are in contact with the silicon substrate.

In the method of fabricating a MIS transistor according to the fourth aspect of the present invention, the surface of the gate electrode is roughened before the salicide step so that the effective width of the silicide film can be further increased, whereby phase transition can be further effectively simplified for reducing the resistance.

In the MIS transistor according to the fifth aspect of the present invention, the exposed portion of the gate electrode surface is increased by the grooves adjacent to the gate electrode, whereby phase transition of silicide is simplified in silicification of the gate electrode surface, and hence increase of gate resistance can be suppressed and the gate electrode can be effectively refined without reducing the operating speed of the MIS transistor.

In the MIS transistor according to the sixth aspect of the present invention, the exposed area of the source/drain layer is increased by the cavities formed in the side walls to attain an action substantially identical to increase of the source/drain layer for the silicide film formed thereon, whereby phase transition of silicide is simplified and resistance parasitic to the source/drain layer can be effectively reduced.

In the MIS transistor according to the seventh aspect of the present invention, the surface of the gate electrode is roughened and this roughening substantially serves as increase of the width of the silicide film formed on the gate electrode surface, phase transition of silicide can be simplified and increase of gate resistance can be suppressed also in case of further refinement, and the refinable range is effectively widened without reducing the operating speed of the MIS transistor.

In the MIS transistor according to the eighth aspect of the present invention, the silicon films formed on the walls of the side walls are connected with the gate electrode while the both are silicified, whereby this substantially serves as increase of the width of the silicide film formed on the gate electrode surface by the silicon films formed on the inner walls, phase transition of silicide can be simplified and increase of gate resistance can be suppressed in case of refining the gate electrode, and the refinable range is effectively widened without reducing the operating speed of the MIS transistor.

In the MIS transistor according to the ninth aspect of the present invention, the surface of the gate electrode is roughened, whereby this substantially serves as increase of the width of the silicide film formed on the gate electrode surface, phase transition of silicide can be simplified and increase of gate resistance can be suppressed also in case of further refinement, and the refinable range is effectively widened without reducing the operating speed of the MIS transistor.

In the MIS transistor according to the tenth aspect of the present invention, the side walls having L-shaped sections are formed to be higher than the gate electrode, whereby the action of preventing short-circuiting across the gate electrode and the source/drain layer can be effectively improved.

In the MIS transistor according to the eleventh aspect of the present invention, the surface of the gate electrode is roughened, whereby this substantially serves as increase of the width of the silicide film formed on the gate electrode surface, phase transition of silicide can be simplified and increase of gate resistance can be suppressed also in case of further refinement, and the refinable range is effectively widened without reducing the operating speed of the MIS transistor.

An object of the present invention is to provide a technique of avoiding short-circuiting across a gate electrode and a source/drain layer in formation of silicide films. Another object of the present invention is to provide a technique of obtaining silicide films whose sheet resistance is not increased even if the width of silicified parts such as upper portions of a gate electrode and a source/drain layer is small.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
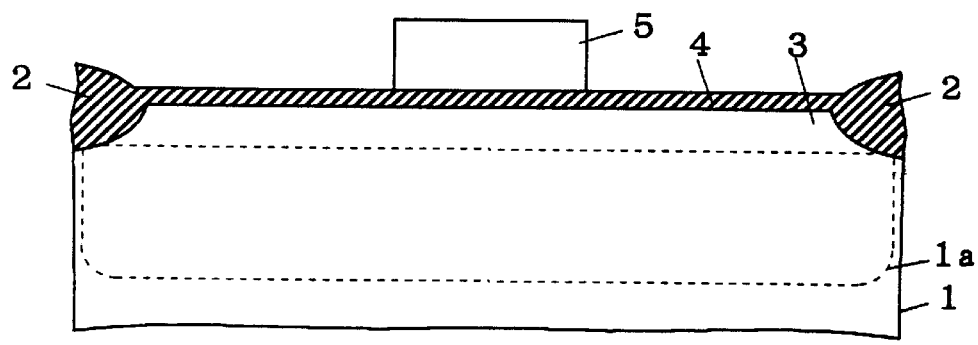
FIG. 1–FIG. 5 are sectional views showing steps of fabricating a MOS transistor according to an embodiment 1 of the present invention.
Figure 2:
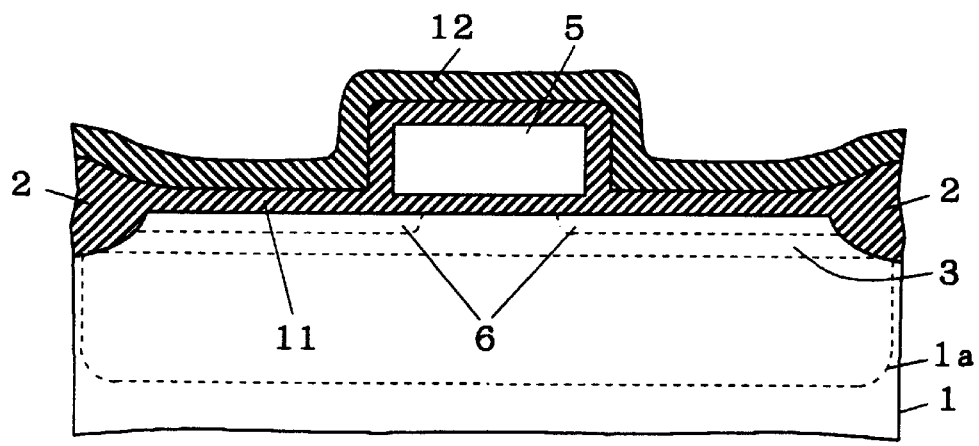

A MOS transistor and a method of fabricating the same according to an embodiment 1 of the present invention are described with reference to FIGS. 1 to 5. FIGS. 1 to 5 are sectional views showing a silicon substrate 1 to be formed with a MOS transistor, particularly a MOS field-effect transistor (hereinafter referred to as a MOSFET) in respective fabrication steps according to the embodiment 1 of the present invention.

First, a general method of fabricating a MOSFET is employed for forming isolation oxide films 2, a well 1a and an impurity layer 3 for controlling a threshold voltage are formed on a portion of the silicon substrate 1 to be formed with the MOSFET. Further, an oxide film (gate insulating film 4) of about 6.5 nm in thickness, for example, is formed on a region enclosed with the isolation oxide films 2 by the general fabrication method, and a polycrystalline silicon film for forming a gate electrode is deposited on this oxide film in a thickness of about 200 nm, for example. After gate doping is performed, a resist film is formed and patterned, for anisotropically etching the polycrystalline silicon film thereby forming a gate electrode 5 (see FIG. 1).

Then, nitrogen is injected into the overall surfaces of regions exposing silicon, and thereafter LDD layers 6 are formed. Silicon oxide is deposited by CVD on the overall surface as a first insulating film of about 15 to 500 Å (e.g., about 150 Å) for forming a silicon oxide film 11, and thereafter silicon nitride is deposited by CVD as a second insulating film of about 300 to 1000 Å (e.g., about 800 Å) for forming a silicon nitride film 12 (see FIG. 2).

Then, the silicon nitride film 12 and the silicon oxide film 11 are etched back by RIE, for forming side walls 15. The side walls 15, having a two-layer structure, consist of a buffer layer 13 which is formed to be in contact with the silicon substrate 1, and silicon nitride layers 14 formed on this buffer layer 13.

Figure 3:
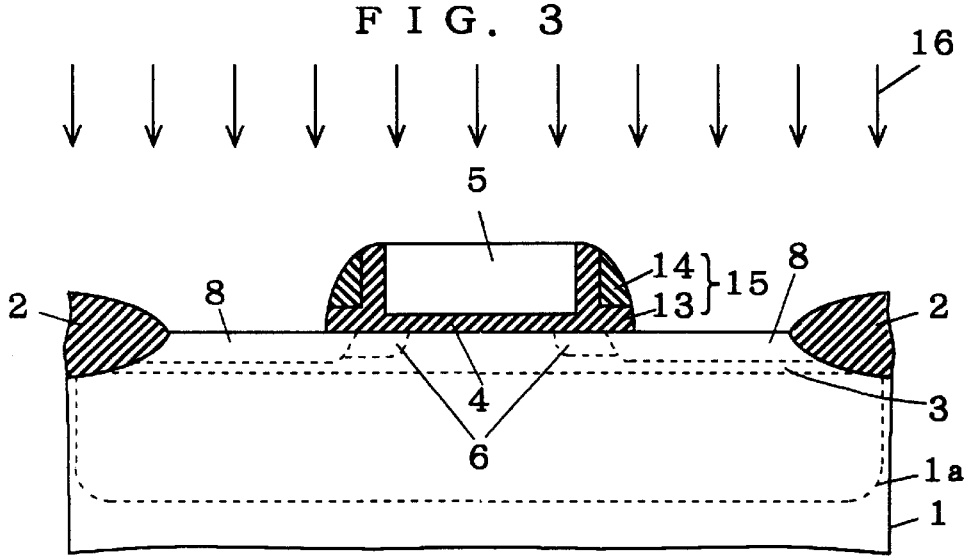

An impurity is added to regions to be formed with source/drain layers and thereafter RTA is carried out at a temperature of about 1000° C. for 30 seconds, for forming high-concentration source/drain layers 8, as shown in FIG. 3.

Figure 4:
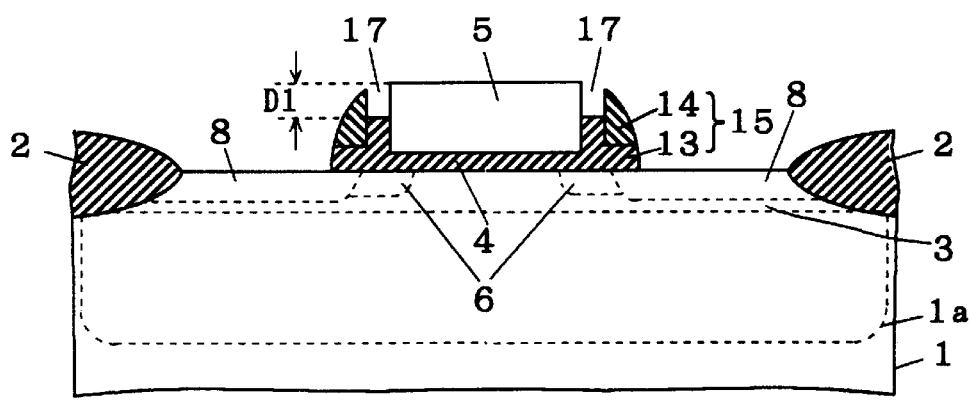

Then, the buffer layer 13 forming the upper portions of the side walls 15 is anisotropically etched with gas 16 hardly corroding the polycrystalline silicon film on the gate electrode 5 and the silicon nitride film 12 serving as the second insulating film, or etched by vapor-phase hydrofluoric acid treatment with sufficient anisotropy. At this time, the buffer layer 13 is etched up to a vertical intermediate portion of the gate electrode 5, not to expose the silicon substrate 1. Thus, grooves 17 can be formed in regions of the side walls 15 adjacent to the gate electrode 5, as shown in FIG. 4.

Figure 5:
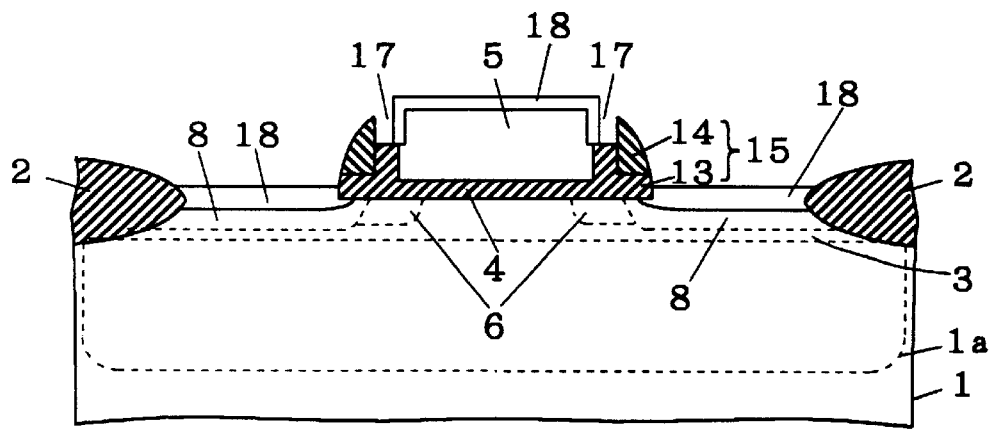

Then, silicide films 18 are formed on an upper portion of the gate electrode 5 and its surfaces which are in contact with the grooves 17 as well as upper portions of the high-concentration source/drain layers 8 respectively through a conventional salicide step, as shown in FIG. 5.

The MOS transistor is fabricated through the aforementioned steps, whereby the silicide film 18 formed on the gate electrode 5, which has grown to creep along side surfaces of the side walls 15, can be stopped in the grooves 17, for example, to be prevented from creeping along the side surfaces of the side walls 15. Thus, short-circuiting across the gate electrode 5 and the high-concentration source/drain layers 8 can be effectively suppressed as compared with the prior art. From another point of view, the distances between the gate electrode 5 and the high-concentration source/drain layers 8 along the surfaces of the side walls 15 are substantially increased by the grooves 17.

In the MOS transistor having the grooves 17, further, the silicide films 18 can grow also on surfaces of the gate electrode 5 located in the grooves 17 respectively. Thus, the width of the silicide film 18 formed on the gate electrode 5 is substantially increased, whereby phase transition of the crystal structure of silicide from a C49 phase to a C54 phase can readily take place in case of titanium silicide, for example, and the gate resistance can be reduced by effectively increasing the width of the silicide film 18 to be at least 0.5 μm in case of forming the gate electrode 5 having a short gate length. The parasitic resistance of the device can be remarkably reduced due to such reduction of the gate resistance, for enabling the MOS transistor to operate at a high speed.

Figure 52:
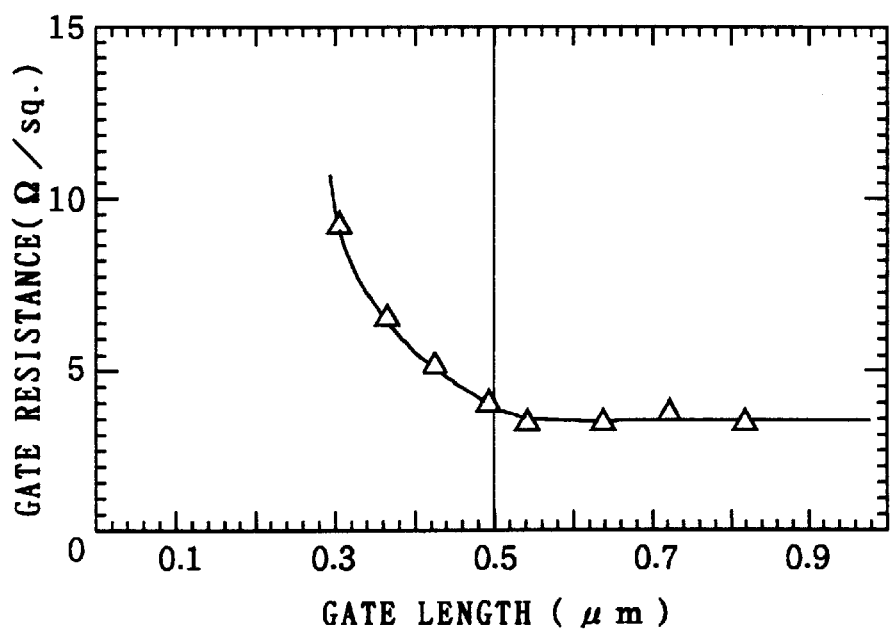
FIG. 52 is a graph showing the relation between gate lengths and gate resistance in a gate electrode made of titanium silicide.

When the gate length is 0.35 μm, for example, the length of the silicified surfaces is (0.35+0.1×2) μm assuming that the depth D1 of the grooves 17 shown in FIG. 4 is 0.1 μm, and the width of the silicide film 18 exceeds 0.5 μm, whereby the gate resistance can be remarkably reduced, as understood also from FIG. 52.

While the side walls 15 have a two-layer structure formed by the buffer layer 13 consisting of silicon oxide and the silicon nitride layers 14, the materials for the side walls 15 are not restricted to silicon oxide and silicon nitride, but outer sides and inner sides, which are closer to the gate electrode 5, of the side walls 15 may alternatively be formed by second and first insulating films which are hardly and readily corroded by an etchant not corroding the gate electrode 5 respectively, in order to attain the effect of the present invention.

Embodiment 2

Figure 6:
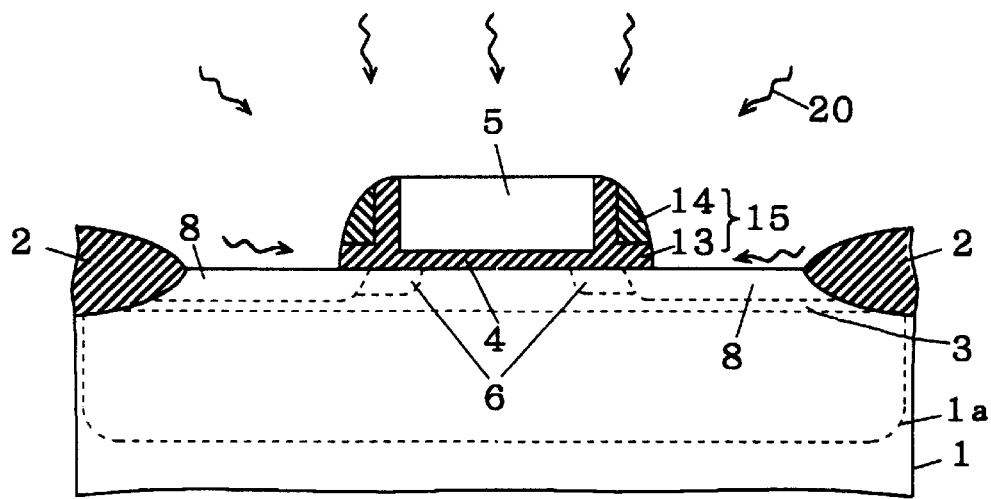
FIG. 6–FIG. 8 are sectional views showing steps of fabricating a MOS transistor according to an embodiment 2 of the present invention; MOS
Figure 7:
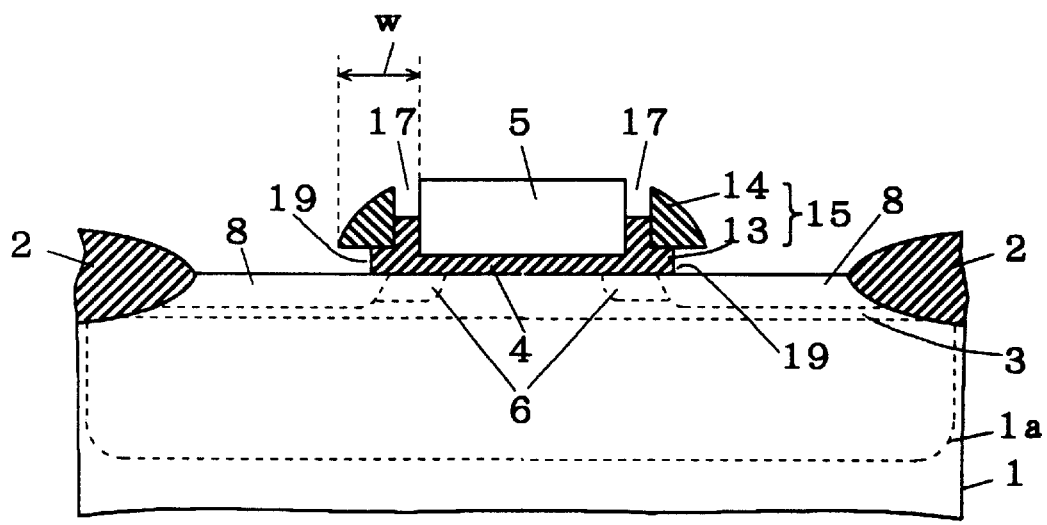
Figure 8:
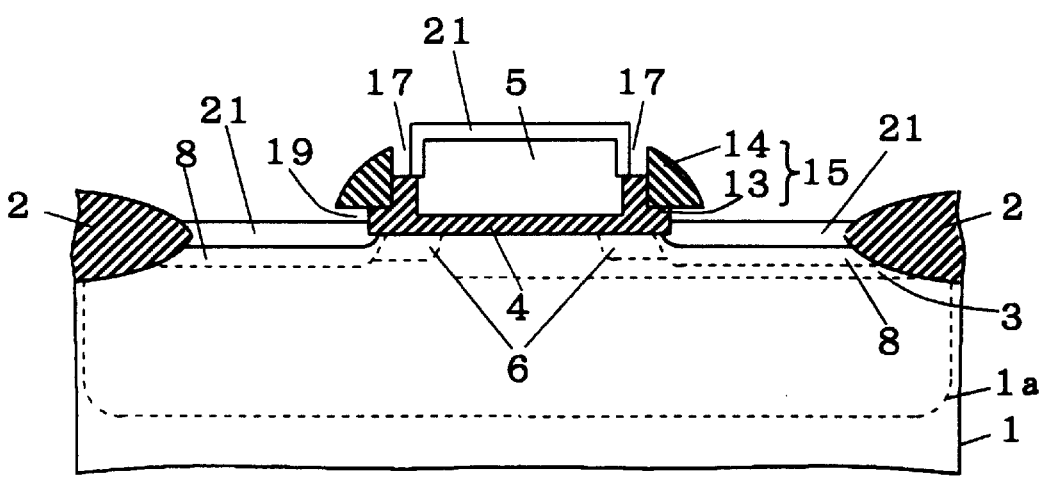

A MOS transistor and a method of fabricating the same according to an embodiment 2 of the present invention are described with reference to FIGS. 6 to 8. FIGS. 6 to 8 are sectional views showing steps of fabricating the MOS transistor according to the embodiment 2 of the present invention respectively.

First, side walls 15 having a two-layer structure and a gate electrode 5 are formed on a region of a silicon substrate 1 enclosed with isolation oxide films 2 as shown in FIG. 6, by the same method as that shown in relation to the embodiment 1 of the present invention.

Then, a buffer layer 13 is isotropiccally etched with a hydrofluoric acid solution 20 hardly corroding polycrystalline silicon and silicon nitride while anisotropically corroding silicon oxide, for forming grooves 17 and cavities 19 in the side walls 15, as shown in FIG. 7. At this time, the etching rate and the etching time are so set that the etching is ended on a vertical intermediate portion of the gate electrode 5 before the grooves 17 reach surface portions of the silicon substrate 1 located on both sides of the gate electrode 5 due to excessive corrosion of portions of the buffer layer 13 located on side surfaces of the gate electrode 5 respectively. Further, the etching rate and the etching time are so set that the etching is ended on an intermediate portion of the side wall width W before the cavities 19 reach the gate electrode 5 due to excessive corrosion of the buffer layer 13 forming lower portions of the side walls 15.

Then, silicide films 21 are formed on an upper portion of the gate electrode 5 and its side surfaces facing the grooves 17 as well as upper portions of high-concentration source/drain layers 8 respectively by a conventional salicide step. The upper portions of the high-concentration source/drain layers 8 include portions exposed by the cavities 19.

Due to fabrication of the MOS transistor through the aforementioned steps, the creeping distance of silicide can be effectively increased by the grooves 17 similarly to the fabrication method for the MOS transistor according to the embodiment 1 of the present invention, while the silicide films 21 formed on the surfaces of the high-concentration source/drain layers 8 can be prevented from creeping up. For example, the creeping distance of silicide along the surfaces of the side walls 15 is increased by the lengths of the cavities 19, whereby the silicide films 21 formed on the surfaces of the high-concentration source/drain layers 8 can be prevented from further extension by the cavities 19.

Further, the MOS transistor provided with the grooves 17 has an effect of reducing the gate length without increasing the resistance value of the gate electrode 5, similarly to the embodiment 1 of the present invention. In the MOS transistor according to the embodiment 2 of the present invention having the cavities 19, in addition, the silicide films 21 can also grow on the surfaces of the high-concentration source/drain layers 8 in the cavities 19. For the silicide films 21 formed on the surfaces of the high-concentration source/drain layers 8, therefore, the MOS transistor has such an effect that the widths of the high-concentration source/drain layers 8, i.e., the distances between the side walls 15 and the isolation oxide films 2, are substantially increased. In case of forming a MOS transistor having short distances between the isolation oxide films 2 and the side walls 15, phase transition from a C49 phase to a C54 phase readily takes when the length of the high-concentration source/drain layers 8 is rendered substantially in excess of 0.5 μm by the depth of the cavities 19 in case of titanium silicide, for example, whereby the parasitic resistance of the source/drain layers 8 can be reduced. Due to such reduction of the parasitic resistance of the source/drain layers 8, the MOS transistor can operate at a higher speed as compared with the conventional MOS transistor of the same size.

Embodiment 3

A MOS transistor and a method of fabricating the same according to an embodiment 3 of the present invention are described with reference to FIGS. 9 to 14. FIGS. 9 to 14 are sectional views showing steps of fabricating the MOS transistor according to the embodiment 3 of the present invention respectively.

Figure 9:
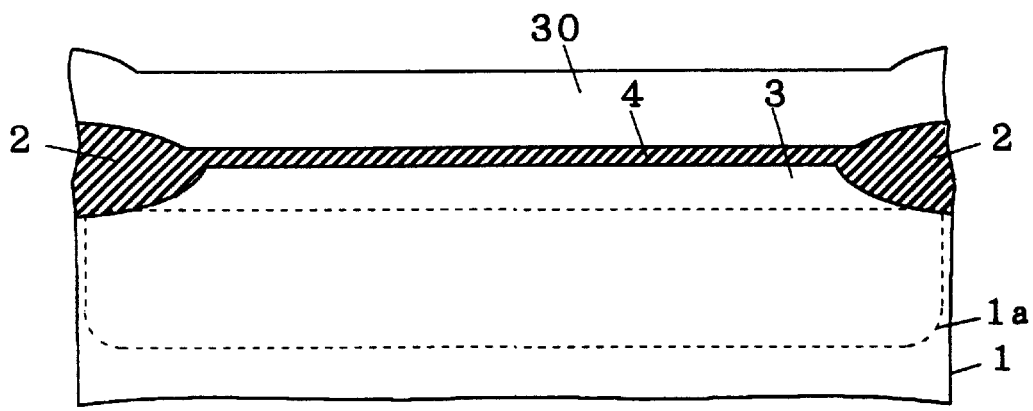
FIG. 9–FIG. 13 are sectional views showing steps of fabricating a first MOS transistor according to an embodiment 3 of the present invention.

First, isolation oxide films 2, a well 1*a* and an impurity layer 3 for controlling a threshold voltage are formed on a silicon substrate 1 by a general method of fabricating a MOSFET. Then, a gate insulating film 4 is deposited on the silicon substrate 1, and an amorphous silicon film 30 is further deposited thereon. FIG. 9 is a sectional view showing the silicon substrate 1 on which the amorphous silicon film 30 is deposited. This amorphous silicon film 30 is deposited at an evaporation temperature of about 520° C. under evaporation pressure of about 2 Torr, with silane (SiH$_4$) at a flow rate of 1300 sccm or disilane (Si$_2$H$_6$) at a flow rate of 100 sccm. At this time, carrier gas such as any of nitrogen (N$_2$), hydrogen (H$_2$), helium (He) and the like, for example, is fed by about 500 sccm. However, the amorphous silicon film 30 can be formed without feeding such carrier gas.

Figure 10:
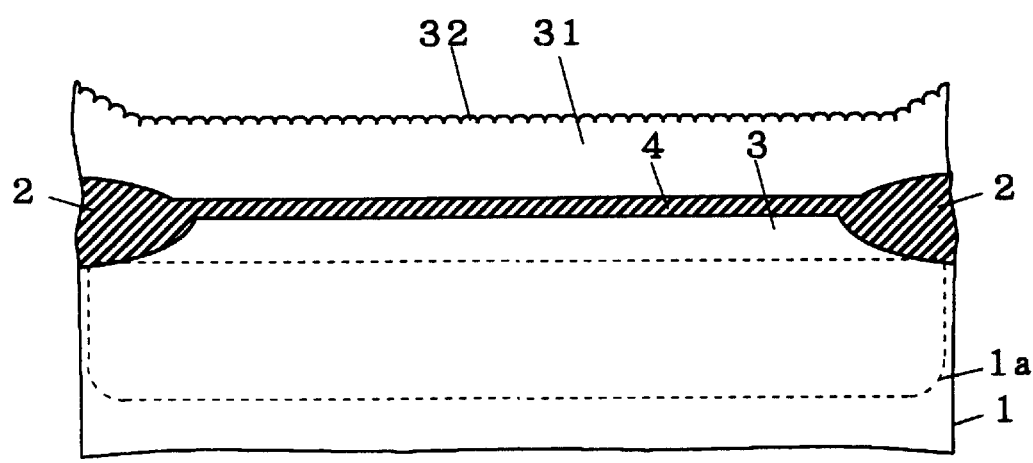

Then, disilane is adsorbed on a silicon surface in a molecular state and decomposed on the surface, thereby forming nuclei for polycrystalline silicon. Then, the temperature of the silicon substrate 1 is increased to about 600 to 700° C. for making crystal growth from the nuclei for polycrystalline silicon on the amorphous silicon 30, thereby converting amorphous silicon to polycrystalline silicon. Thus formed is a silicon film 31 including a surface roughened by a number of semispherical projections 32, as shown in FIG. 10. In case of forming a TiSi$_2$ film of 300 to 1000 Å in thickness, the diameters of the projections 32 are preferably at least 0.05 μm, in order to sufficiently attain an effect of simplifying phase transition. If the physical gate length is 0.3 to 0.5 μm, the diameters of the projections 32 are preferably not more than about 0.3 μm, in order to suppress dispersion of the substantial gate length when a plurality of sections are observed perpendicularly to the plane of the figure. In general, the sizes, i.e., the diameters of the semispherical projections 32 can be measured by observation with a scanning microscope. Roughening treatment is described in "Growth mechanism of polycrystalline Si films with hemisperical grains" by Toru Tatsumi, Akira Sakai, Taeko Ikarashi and Hirohito Watanabe, Applied Physics, 1992, Vol. 61, No. 11, pp. 1147 to 1151, for example.

Figure 11:
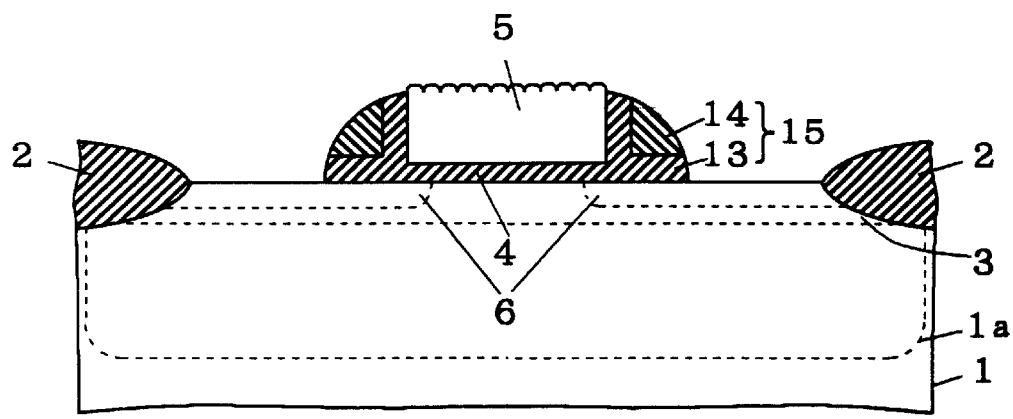

Then, the silicon film 31 is patterned to form a gate electrode 5, followed by formation of LDD layers 6. Thereafter a silicon oxide film is deposited by CVD as a first insulating film of about 150 to 500 Å, for example, and a silicon nitride film is deposited on this first insulating film by CVD as a second insulating film of about 300 to 1000 Å, for example. The first and second insulating films are etched back by RIE, whereby side walls 15 of a two-layer structure can be formed on both sides of the gate electrode 5, as shown in FIG. 11. These side walls 15 are formed by a buffer layer 13, having L-shaped sections and consisting of the first insulating film, which is in contact with the silicon substrate 1 and the gate electrode 5, and silicon nitride layers 14, consisting of the second insulating film, which are formed to be held by two sides of the buffer layer 13 defining the L-shaped sections.

Figure 12:
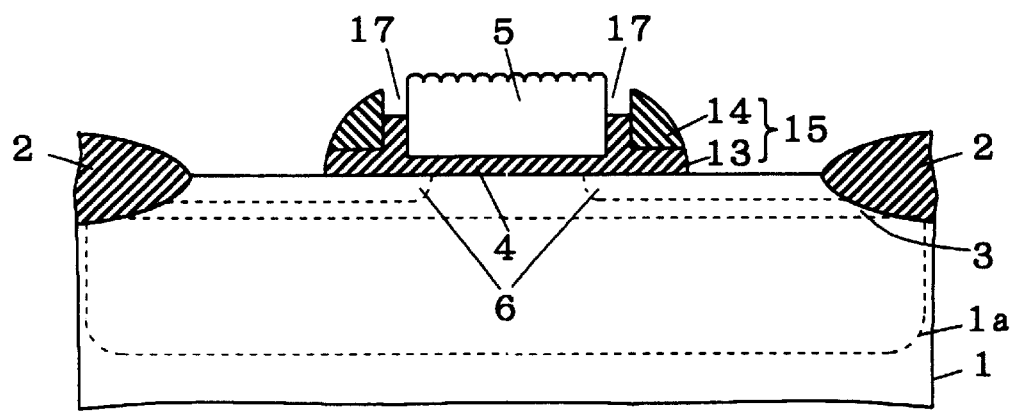
Figure 13:
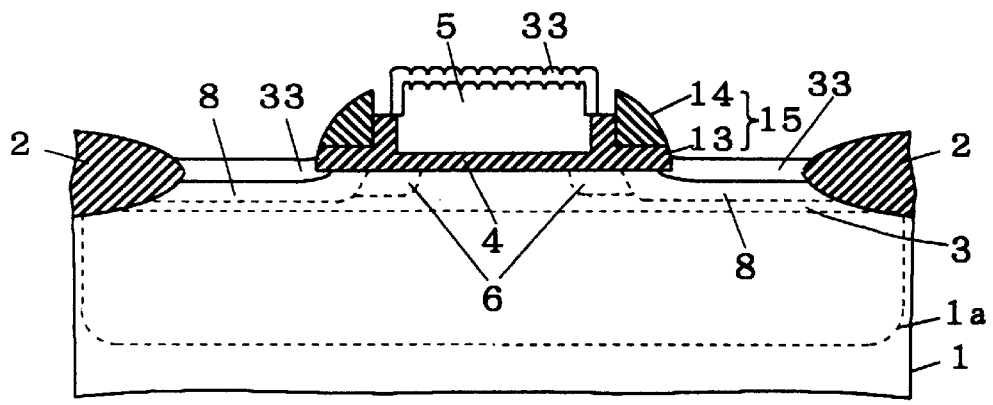

Thereafter grooves 17 are formed in the side walls 15 to be adjacent to an upper portion of the gate electrode 5 by a method similar to that in the embodiment 1 of the present invention, as shown in FIG. 12. High-concentration source/drain layers 8 are formed, and thereafter silicide films 33 are formed on upper portions of the gate electrode 5 and the high-concentration source/drains 8 by a salicide step similarly to the embodiment 1 of the present invention, as shown in FIG. 13.

The silicide films 33 according to the embodiment 3 are different from the silicide films 18 according to the embodiment 1 in a point that the upper surface of the gate electrode 5 is roughened by the projections 32 in the embodiment 3. When the MOS transistors according to the embodiments 1 and 3 are rendered identical in size to each other, therefore, the substantial width of the silicide film 33 formed on the gate electrode 5 according to the embodiment 3 is longer than that in the embodiment 1. Thus, the gate length remarkably increasing the gate resistance by phase transition of silicide is smaller in the MOS transistor according to the embodiment 3 as compared with that according to the embodiment 1. Therefore, the MOS transistor according to the embodiment 3 is further suitable for refinement, and has a higher effect of improving the degree of integration when applied to an integrated circuit.

Figure 14:
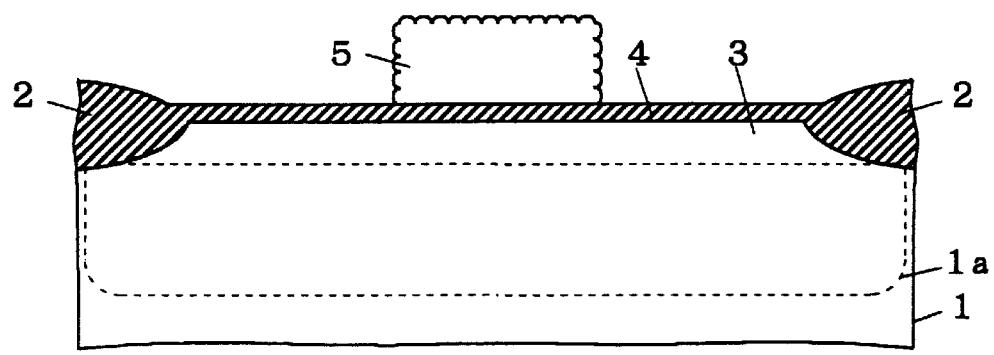
FIG. 14–FIG. 16 are sectional views showing steps of fabricating a second MOS transistor according to the embodiment 3 of the present invention.
Figure 15:
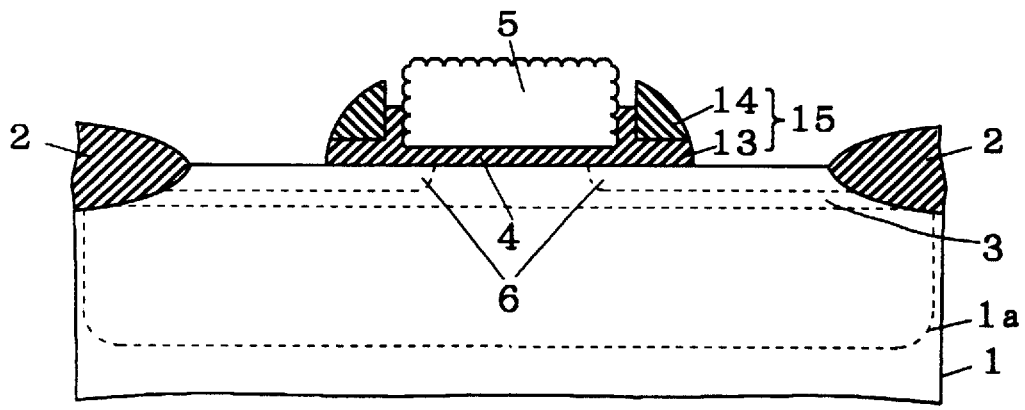
Figure 16:
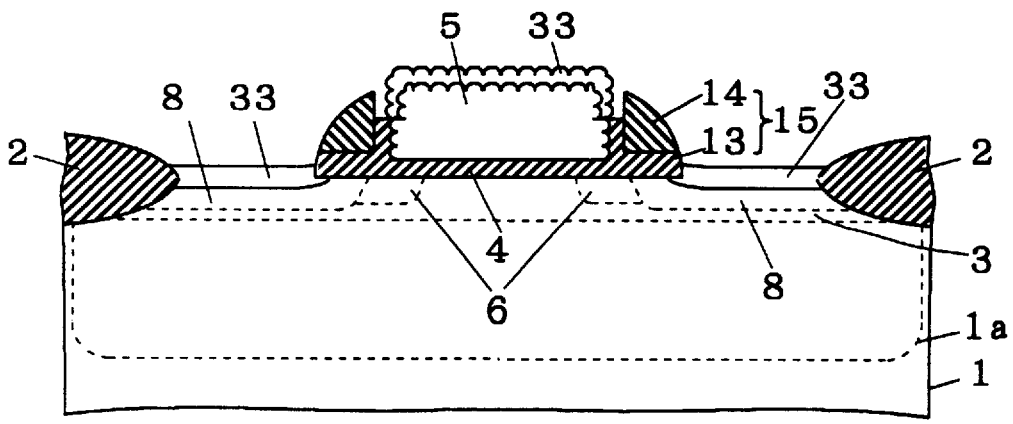

The roughening step in the embodiment 3 of the present invention may alternatively be carried out after forming the gate electrode 5 consisting of amorphous silicon by patterning the amorphous silicon film 30. FIG. 14 shows the roughened state of the gate electrode 5. In this case, the remaining steps are similar to those described with reference to the embodiment 3. FIGS. 15 and 16 are sectional views showing the silicon substrate 1 immediately after formation of the side walls 15 and after formation of the silicide films 33 respectively.

Figure 17:
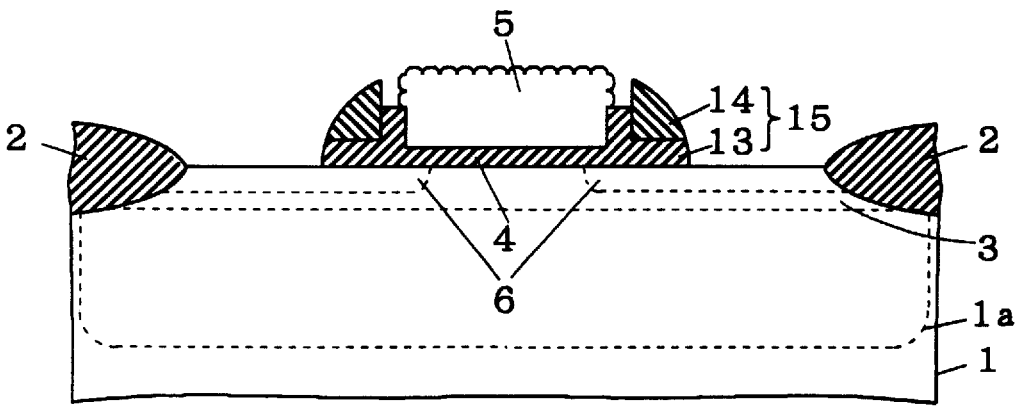
FIG. 17 and FIG. 18 are sectional views showing steps of fabricating a third MOS transistor according to the embodiment 3 of the present invention.
Figure 18:
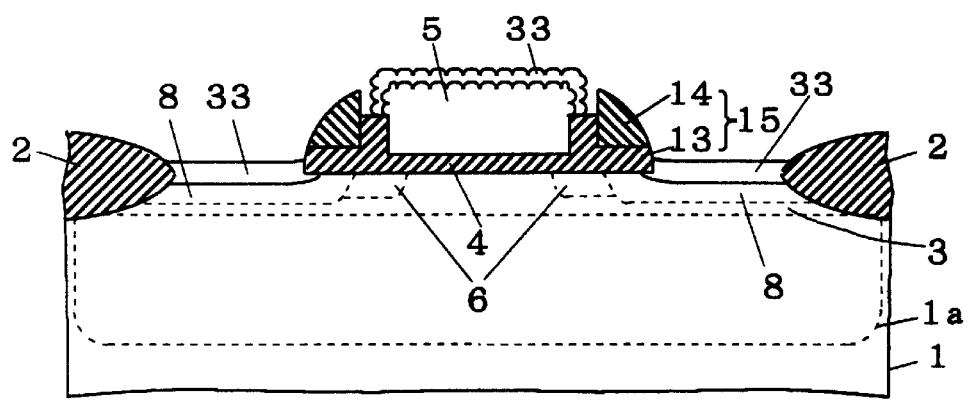

Further alternatively, the gate electrode 5 prepared from amorphous silicon may be roughened after formation of the side walls 15. In this case, however, it is necessary to employ CVD as the method of depositing the first and second insulating films for forming the side walls 15 while keeping the temperatures for depositing the first and second insulating films at levels of not more than 600° C., so that the material forming the gate electrode 5 is not converted from amorphous silicon to polycrystalline silicon. The buffer layer 13 presents the sectional shapes shown in FIG. 4 when anisotropically etched, and the gate electrode 5 consists of amorphous silicon at this time. FIG. 17 shows a sectional shape of the silicon substrate 1 after roughening the gate electrode 5 having the sectional shape shown in FIG. 4. FIG. 18 shows a state of the silicon substrate 1, having the shape shown in FIG. 17, subjected to a salicide step for forming the silicide films 33 on the surfaces of the gate electrode 5 and the high-concentration source/drain layers 8 respectively.

Embodiment 4

Figure 19:
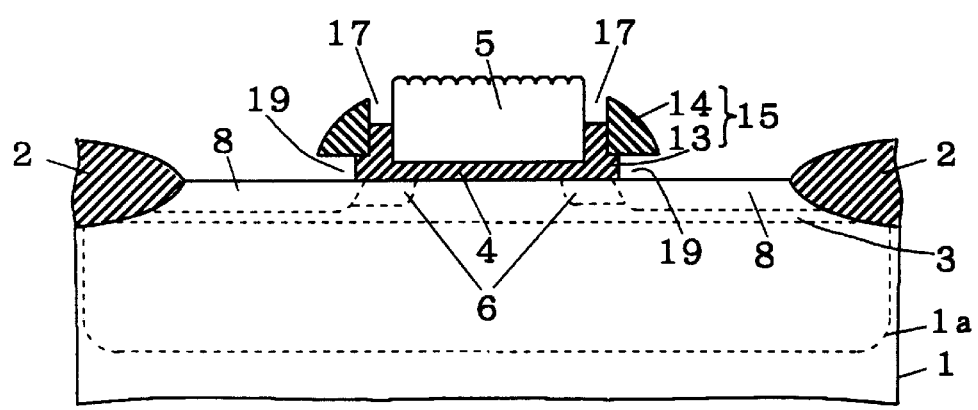
FIG. 19 and FIG. 20 are sectional views showing steps of fabricating a first MOS transistor according to an embodiment 4 of the present invention.
Figure 20:
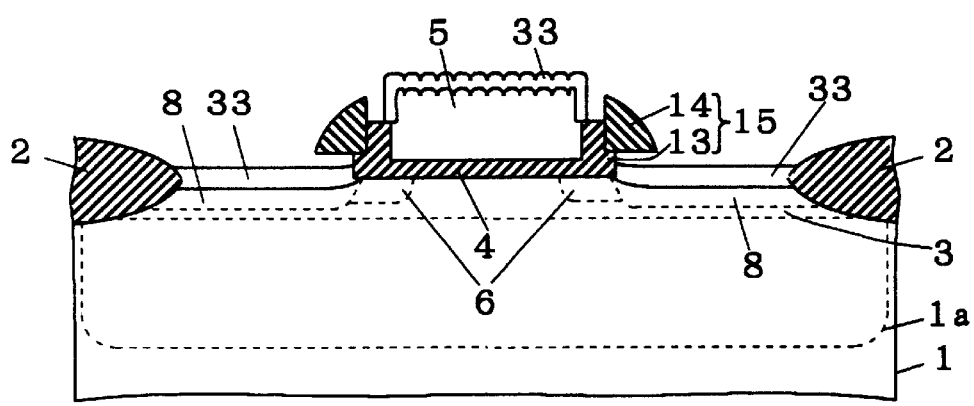

A MOS transistor and a method of fabricating the same according to an embodiment 4 of the present invention are described with reference to FIGS. 10, 19 and 20. FIGS. 19 and 20 are sectional views showing steps of fabricating the MOS transistor according to the embodiment 4 of the present invention respectively.

First, a roughened polycrystalline silicon film 31 is formed by a method similar to that in the embodiment 3 of the present invention, as shown in FIG. 10.

Then, a roughened gate electrode 5 and side walls 15 having grooves 17 and cavities 19 are formed by a method similar to that described with reference to the embodiment 2 of the present invention, as shown in FIG. 19. High-concentration source/drain layers 8 are formed on the silicon substrate 1 shown in FIG. 19, and thereafter a salicide step is applied to the silicon substrate 1, thereby forming silicide films 33 on a surface of the gate electrode 5 and upper surfaces of the high-concentration source/drain layers 8 respectively (see FIG. 20).

Figure 21:
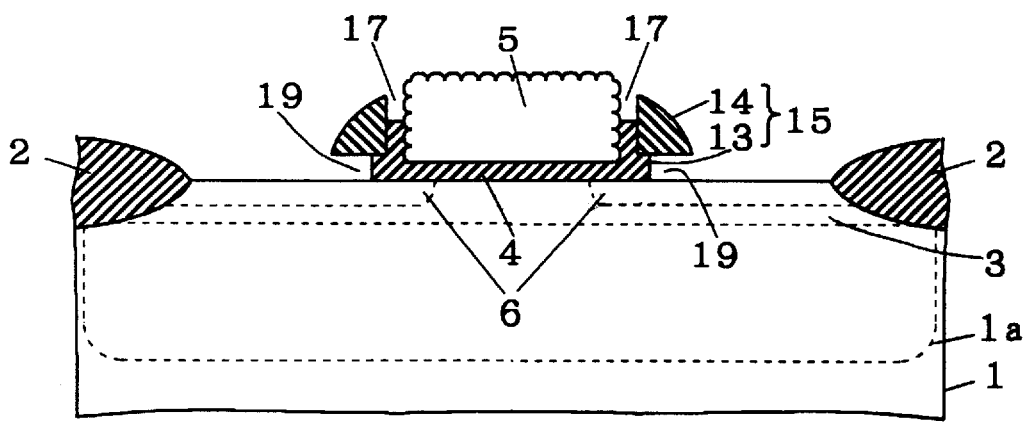
FIG. 21 and FIG. 22 are sectional views showing steps of fabricating a second MOS transistor according to the embodiment 4 of the present invention.
Figure 22:
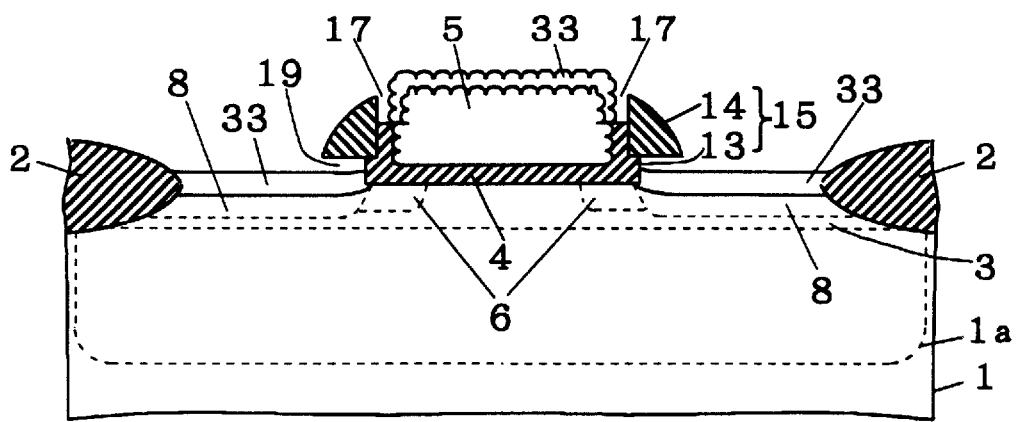

The roughening step in the embodiment 4 of the present invention may alternatively be carried out after forming the gate electrode 5 by patterning the amorphous silicon film 30. FIG. 14 shows the roughened state of the gate electrode 5. In this case, the remaining steps are similar to those described with reference to the embodiment 4 of the present invention. FIGS. 21 and 22 are sectional views showing the silicon substrate 1 immediately after formation of the side walls 15 and after formation of the silicide films 33 respectively.

Figure 23:
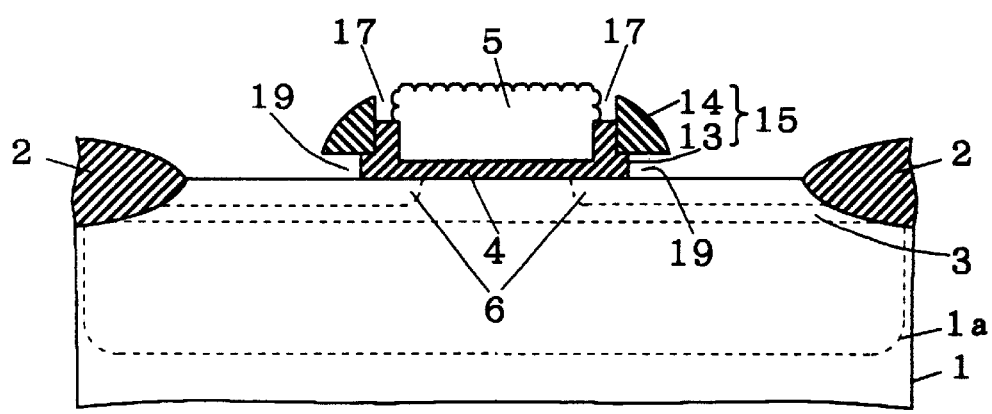
FIG. 23 and FIG. 24 are sectional views showing steps of fabricating a third MOS transistor according to the embodiment 4 of the present invention.
Figure 24:
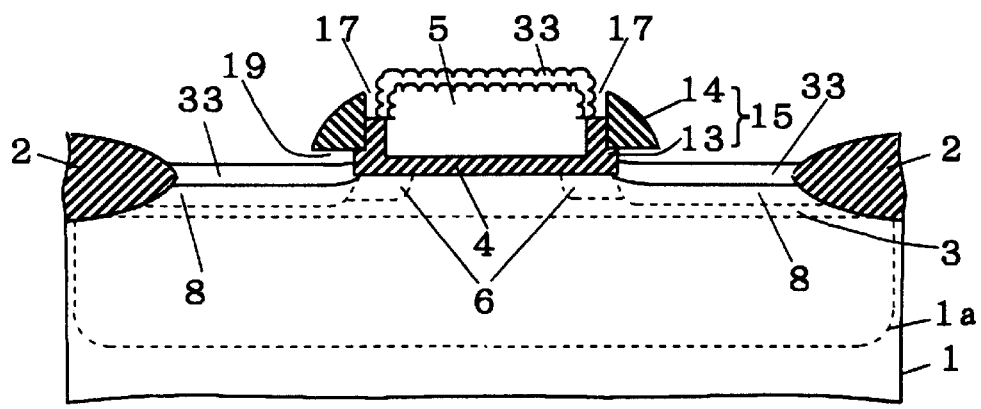

Further alternatively, the gate electrode 5 prepared from amorphous silicon may be roughened after formation of the side walls 15. In this case, however, it is necessary to employ CVD as the method of depositing the first and second insulating films for forming the side walls 15 while keeping the temperatures for depositing the first and second insulating films at levels of not more than 600° C., so that the material forming the gate electrode 5 is not converted from amorphous silicon to polycrystalline silicon. A buffer layer 13 presents sectional shapes shown in FIG. 7 when anisotropically etched, and the gate electrode 5 consists of amorphous silicon at this time. FIG. 23 shows a sectional shape of the silicon substrate 1 after roughening the gate electrode 5 having the sectional shape shown in FIG. 7. FIG. 24 shows a state of the silicon substrate 1, having the shape shown in FIG. 23, formed with the high-concentration source/drain layers 8 and subjected to a salicide step for forming the silicide films 33 on the upper surfaces of the gate electrode 5 and the high-concentration source/drain layers 8 respectively.

Embodiment 5

A MOS transistor and a method of fabricating the same according to an embodiment 5 of the present invention are described with reference to FIGS. 25 to 29. FIGS. 25 to 29 are sectional views showing steps of fabricating the MOS transistor according to the embodiment 5 of the present invention respectively.

First, isolation oxide films 2, a well 1a and an impurity layer 3 for controlling a threshold voltage are formed on a silicon substrate 1 by a general method of fabricating a MOSFET. Then, a gate insulating film 4 is deposited on the silicon substrate 1, and a polycrystalline silicon film for defining a gate electrode is deposited thereon.

Figure 25:
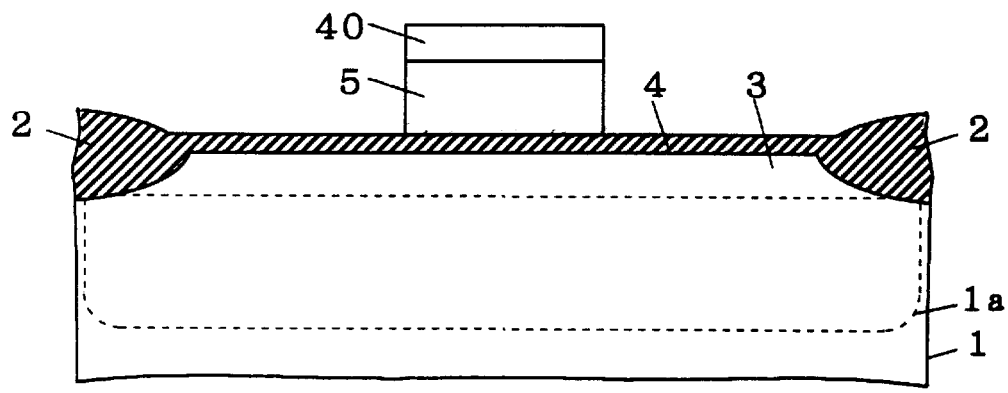
FIG. 25–FIG. 29 are sectional views showing steps of fabricating a MOS transistor according to an embodiment 5 of the present invention.

Then, a stacked film is deposited on the polycrystalline silicon film by about 500 Å, for example. This stacked film is prepared from silicon nitride, for example. A resist film is patterned through a photolithographic step, thereafter the stacked film is anisotropically etched, and the polycrystalline silicon film is anisotropically etched through the etched stacked film serving as a mask, thereby forming a gate electrode 5. At this time, a cap layer 40 is formed on the gate electrode 5, as shown in FIG. 25.

Figure 26:
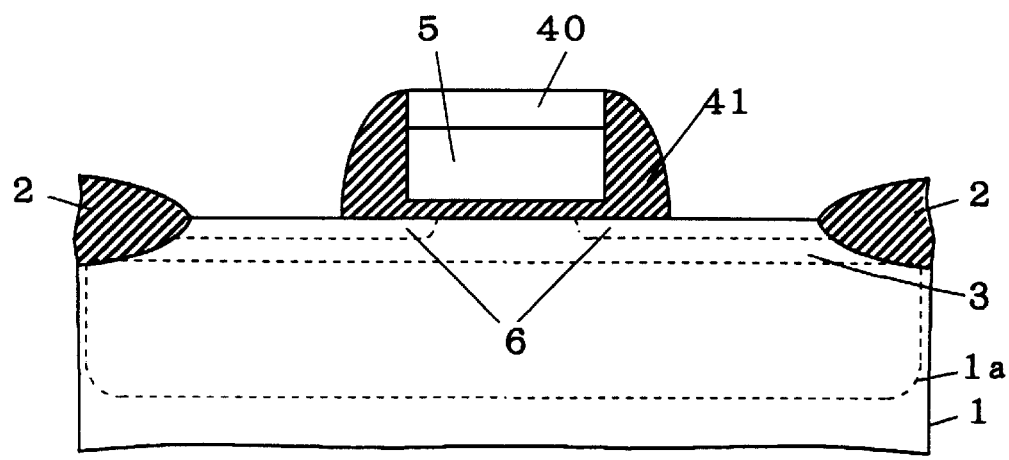

After formation of LDD layers 6, a silicon oxide film is deposited by CVD as an insulating film of about 600 to 1500 Å, for example, for forming side walls. The silicon oxide film is etched back by RIE for forming side walls 41, as shown in FIG. 26. At this time, the etching conditions are so set that the cap layer 40 prepared from silicon nitride still remains after the silicon oxide film is etched back.

Then, silicon nitride is etched with hot phosphoric acid hardly corroding polycrystalline silicon and silicon oxide, for removing the cap layer 40. The side walls 41 formed in this manner are higher than the gate electrode 5.

Figure 27:
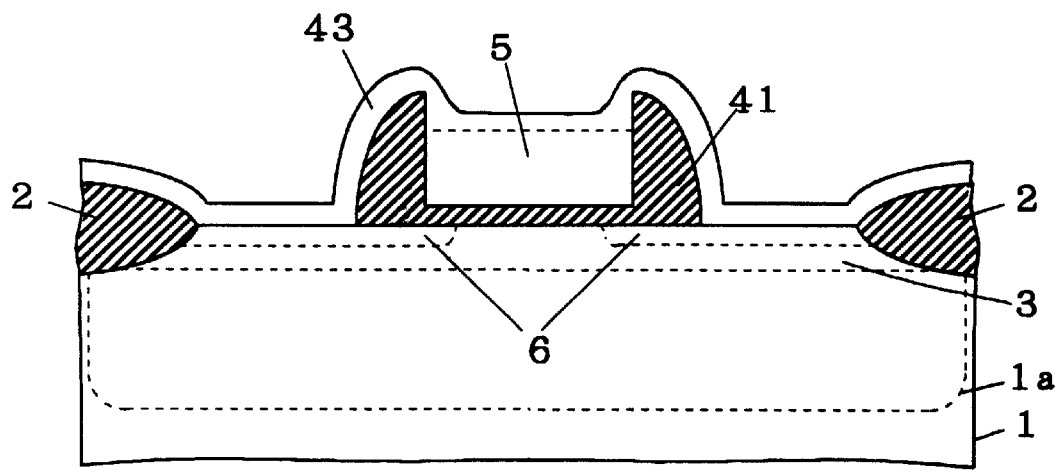
Figure 28:
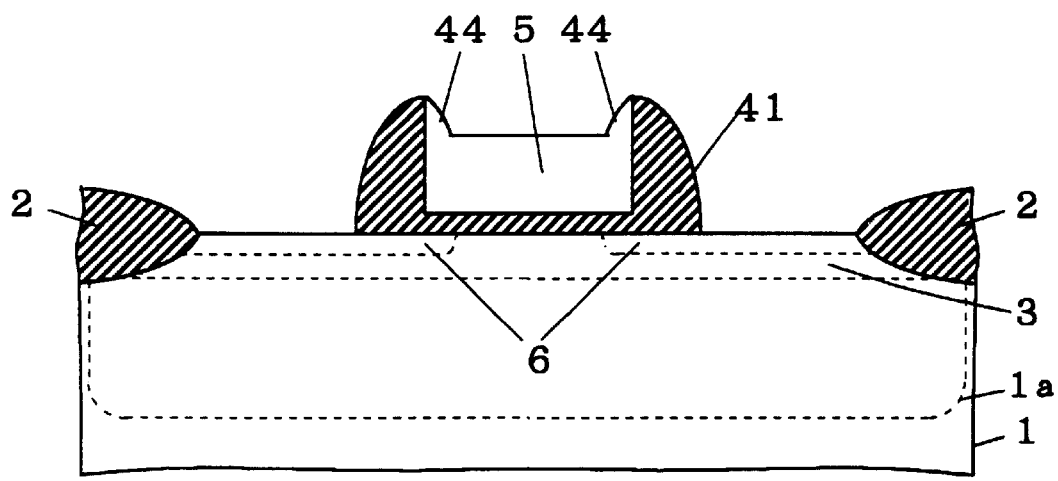

Then, polycrystalline silicon is deposited by about 300 to 500 Å, for forming a polycrystalline silicon (or amorphous silicon) layer 43. FIG. 27 is a sectional view showing this state. This polycrystalline silicon (or amorphous silicon) layer 43 is etched back for forming side walls 44 of polycrystalline silicon (or amorphous silicon) on inner walls of the side walls 41, as shown in FIG. 28. At this time, the gate electrode 5 may be slightly etched, so far as the same does not reach the gate insulating film 4. Further, the silicon substrate 1 may also be etched by a depth of not more than about 500 Å, for example, not influencing the transistor properties.

Figure 29:
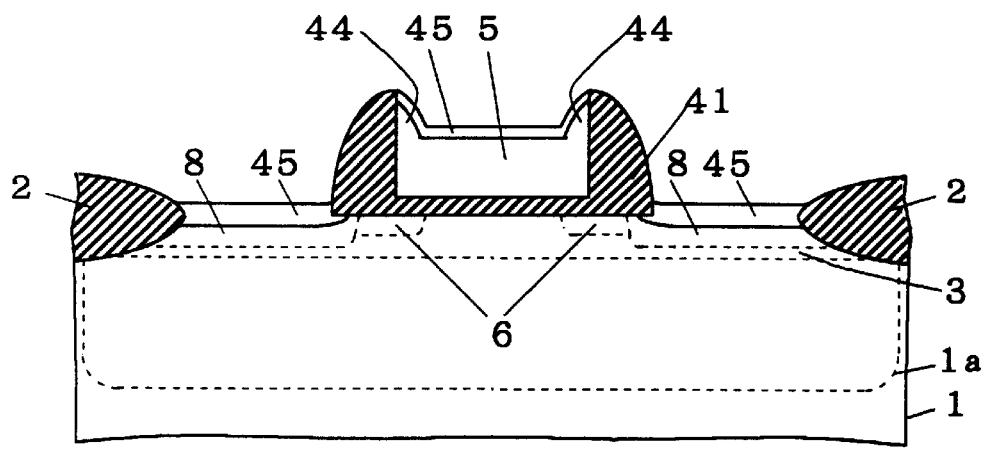

Then, high-concentration source/drain layers 8 are formed. Thereafter silicide. films 45 are formed on surfaces of the gate electrode 5 and the high-concentration source/drain layers 8 respectively through a salicide step similar to that of the prior art, as shown in FIG. 29.

The MOS transistor formed in the aforementioned manner has the high side walls 41, whereby the distances between the side walls 44 which are electrically connected with the gate electrode 5 and the high-concentration source/drains 8 are longer as compared with side walls of general height, and it is possible to suppress occurrence of short-circuiting across the gate electrode 5 and the source/drain layers 8 caused by the silicide films 45 creeping along surfaces of the side walls 41.

Further, the silicide films 45 are formed also on the surfaces of the side walls 44 of polycrystalline silicon formed on the inner walls of the side walls 41, whereby this serves as increase of the widths of the silicide films 45. In case of refining the gate electrode 5 to a gate length hardly causing phase transition of silicide, it is possible to readily cause phase transition of the silicide films 45 by extending the gate length by the lengths of the side walls 44 with respect to the silicide films 45. The gate resistance can be reduced, whereby the parasitic resistance of the MOS transistor can be extremely reduced as compared with a conventional MOS transistor of the same size, and the inventive MOS transistor can operate at a higher speed.

While silicon nitride is employed for the cap layer 40 in the aforementioned embodiment, the cap layer 40 may be prepared from any material which can etch the silicon substrate 1 with sufficient selectivity for the side walls 41 and the gate electrode 5.

Embodiment 6

A MOS transistor and a method of fabricating the same according to an embodiment 6 of the present invention are described with reference to FIGS. 30 to 34. FIGS. 30 to 34 are sectional views showing steps of fabricating the MOS transistor according to the embodiment 6 of the present invention respectively.

First, a silicon substrate 1 is so prepared that a polycrystalline silicon film 31 having an irregular surface as shown in FIG. 10 is deposited thereon, similarly to the fabrication method according to the embodiment 3 of the present invention.

Figure 30:
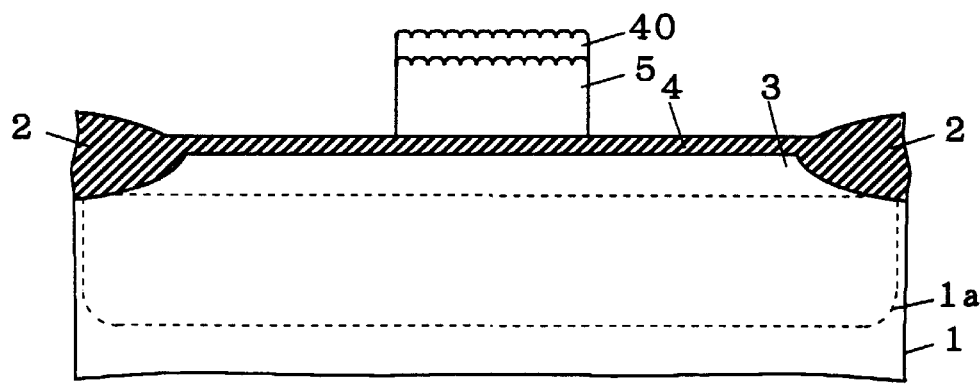
FIG. 30–FIG. 34 are sectional views showing steps of fabricating a first MOS transistor according to an embodiment 6 of the present invention.
Figure 31:
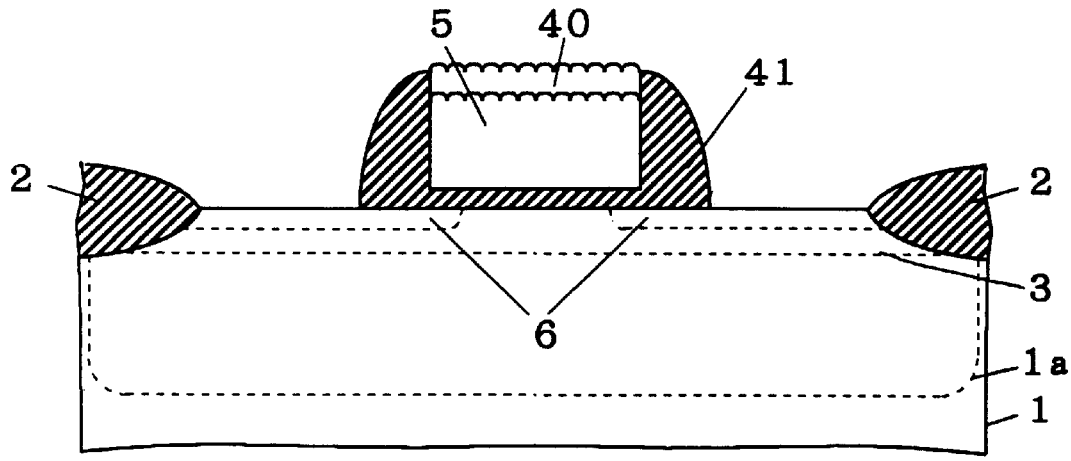
Figure 32:
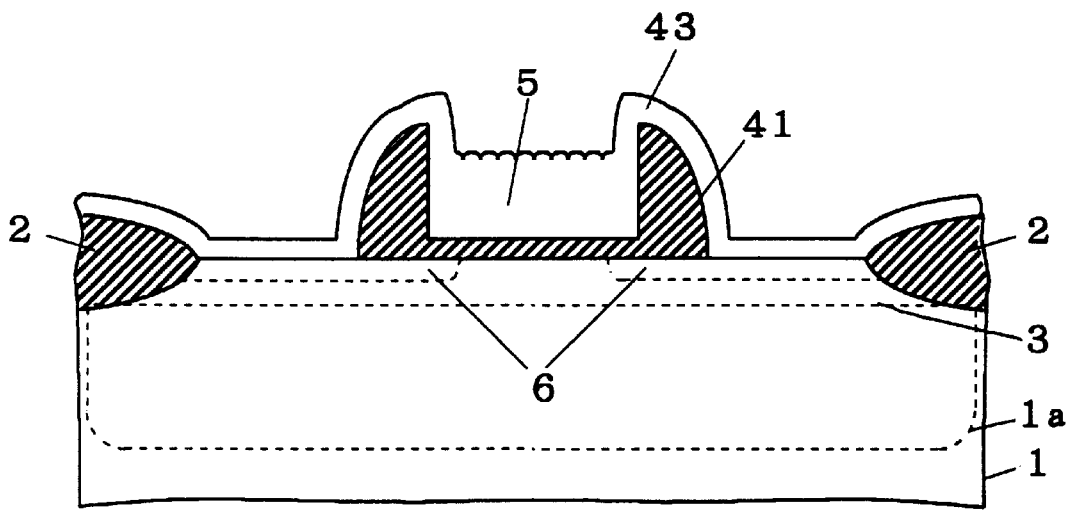
Figure 33:
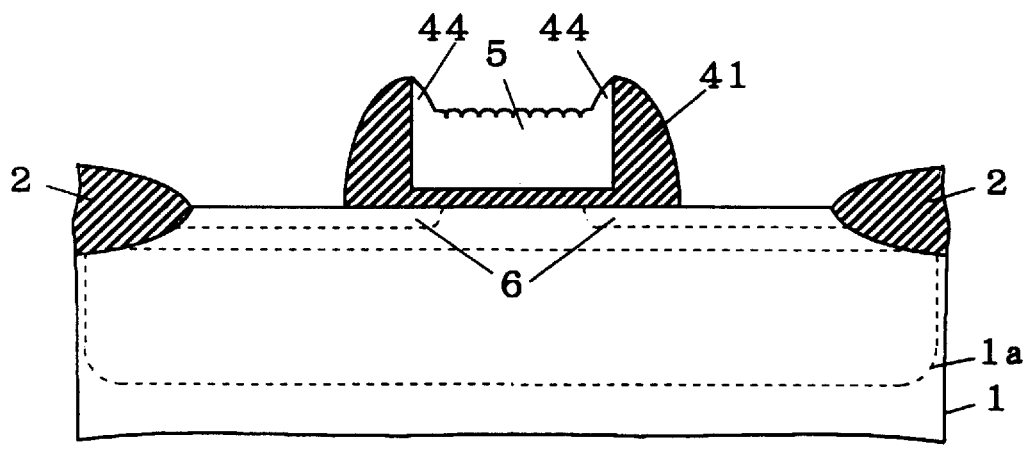
Figure 34:
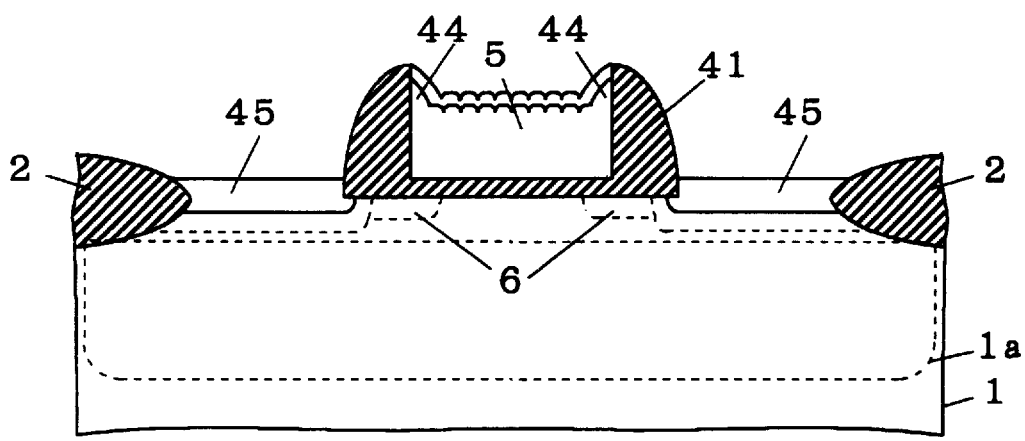

Then, a stacked film is deposited on the polycrystalline silicon film 31 by about 500 Å, for example. This stacked film is prepared from silicon nitride, for example. A resist film is patterned through a photolithographic step, thereafter the stacked film is anisotropically etched, and the polycrystalline silicon film 31 is anisotropically etched through the etched stacked film serving as a mask, thereby forming a gate electrode 5. At this time, a cap layer 40 having an irregular surface is formed on the gate electrode 5, as shown in FIG. 30.

Sectional shapes shown in FIGS. 31 to 34 are formed through steps identical to those for working the silicon substrate 1 shown in FIGS. 26 to 29 in relation to the embodiment 5 of the present invention.

In order to fabricate the MOS transistor according to the embodiment 6 of the present invention, a step for roughening a surface of the gate electrode 5 must be added to the steps similar to those for fabricating the MOS transistor according to the embodiment 5 of the present invention.

In the MOS transistor according to the embodiment 6 of the present invention, roughening of the surface of the gate electrode 5 has the same effect as that the widths of silicide films 45 are substantially increased as compared with the MOS transistor according to the embodiment 5. When the gate electrode 5 is refined to a gate length hardly causing phase transition of silicide, therefore, the gate resistance can be reduced by facilitating phase transition of the silicide films 45, and hence the MOS transistor according to the embodiment 6 of the present invention is suitable for refinement as compared with that according to the embodiment 5.

Figure 35:
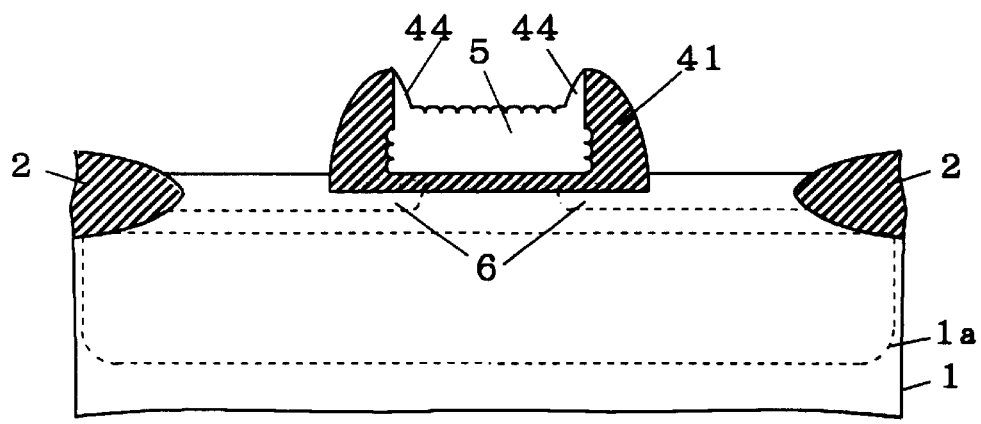
FIG. 35 and FIG. 36 are sectional views showing steps of fabricating a second MOS transistor according to the embodiment 6 of the present invention.
Figure 36:
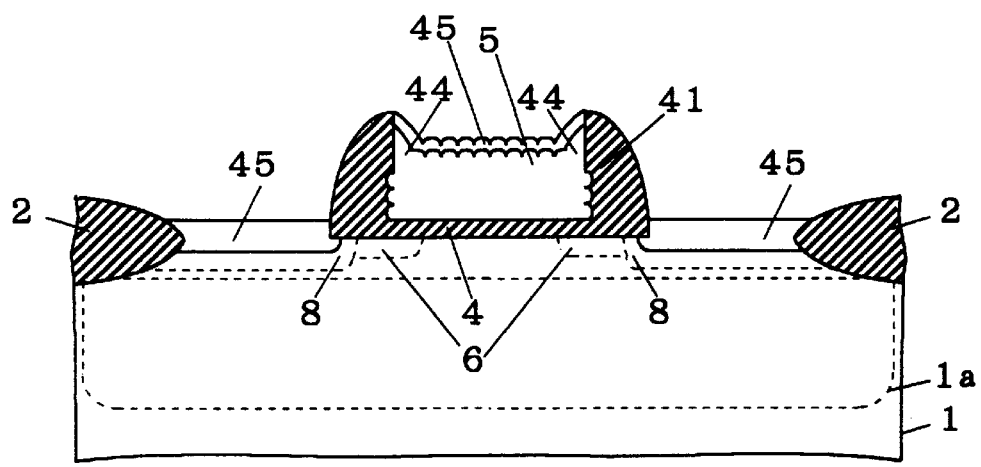

Among the fabrication steps in the embodiment 6 of the present invention, the step of roughening the surface of the gate electrode 5 may be carried out before formation of side walls 41 and immediately after formation of the gate electrode 5. FIGS. 35 and 36 corresponding to FIGS. 28 and 29 respectively show the sectional shape of a silicon substrate 1 which is thereafter formed through steps similar to those of the embodiment 6.

Among the fabrication steps of the embodiment 6 of the present invention, the step of roughening the surface of the gate electrode 5 may alternatively be carried out after formation of side walls 41 before forming polycrystalline silicon or amorphous silicon layers on inner walls of the side walls 41. In this case, it is necessary to deposit silicon nitride through a CVD process at a low temperature of not more than 600° C., for preventing polycrystal growth of amorphous silicon forming the gate electrode 5 in deposition of silicon oxide for forming the side walls 41.

Figure 37:
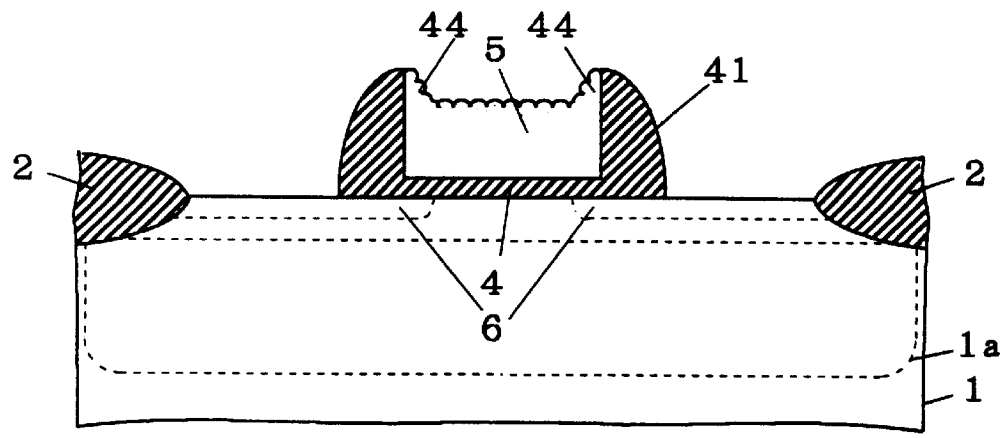
FIG. 37 and FIG. 38 are sectional views showing steps of fabricating a third MOS transistor according to the embodiment 6 of the present invention.
Figure 38:
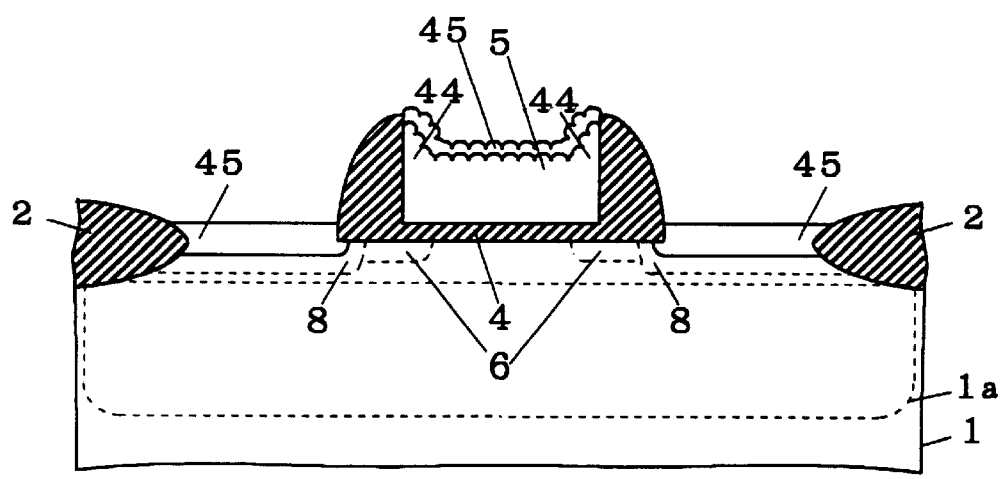

Among the fabrication steps of the embodiment 6 of the present invention, the step of roughening the surface of the gate electrode 5 may further alternatively be carried out after a step of forming side walls 44 of silicon on inner walls of side walls 41. FIGS. 37 and 38 corresponding to FIGS. 28 and 29 respectively illustrate a sectional shape of a silicon substrate 1 thereafter formed through steps similar to those of the embodiment 6. Also in this case, it is necessary to deposit silicon oxide for forming the side walls 41 through a CVD process at a low temperature of not more than 600° C.

Embodiment 7

A MOS transistor and a method of fabricating the same according to an embodiment 7 of the present invention are described with reference to FIGS. 25 and 39 to 42. FIGS. 39 to 42 are sectional views showing steps of fabricating the MOS transistor according to the embodiment 7 of the present invention respectively.

First, a silicon substrate 1 is so prepared that a cap layer 40 is formed on a gate electrode 5 as shown in FIG. 25 through steps similar to those of the embodiment 5 of the present invention.

Figure 39:
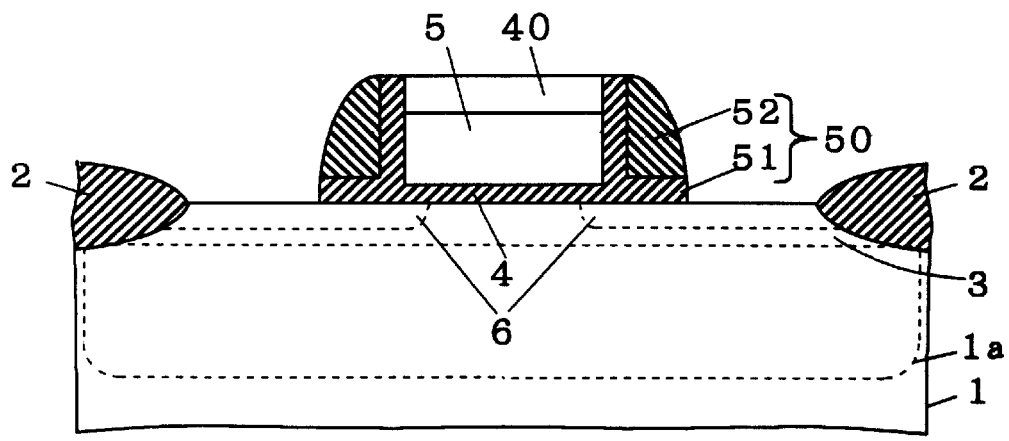
FIG. 39–FIG. 42 are sectional views showing steps of fabricating a first MOS transistor according to an embodiment 7 of the present invention.

Then, after forming LDD layers 6, silicon oxide is deposited by CVD as a first insulating film of about 150 to 500 Å for forming side walls, and silicon nitride is deposited on this silicon oxide film as a second insulating film of about 300 to 1000 Å for forming side walls. FIG. 39 shows the first and second insulating films etched back by RIE. At this time, conditions are so set that the cap layer 40 provided on the gate electrode 5 still remains after the first and second insulating films are etched back. Side walls 50 of a two-layer structure shown in FIG. 39 are formed by first and second insulating films 51 and 52.

Figure 40:
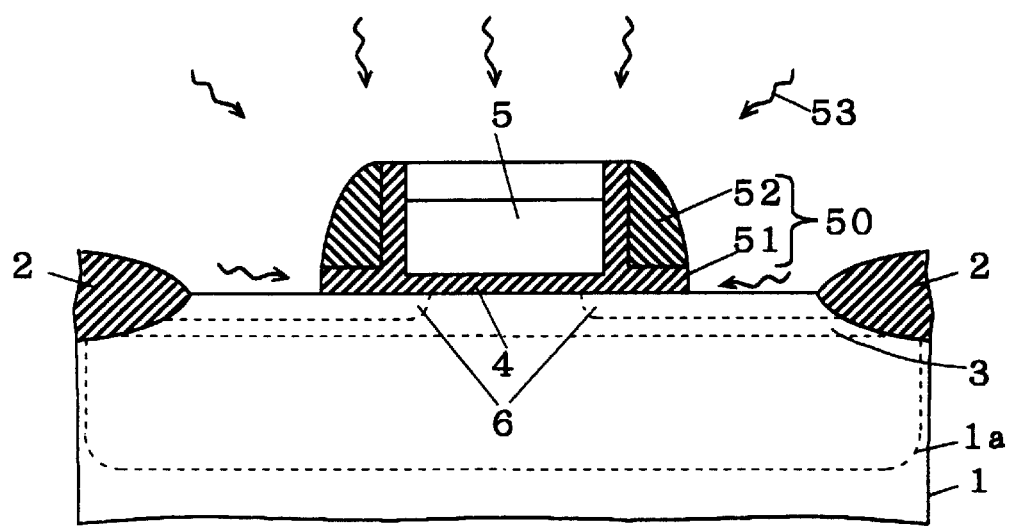
Figure 41:
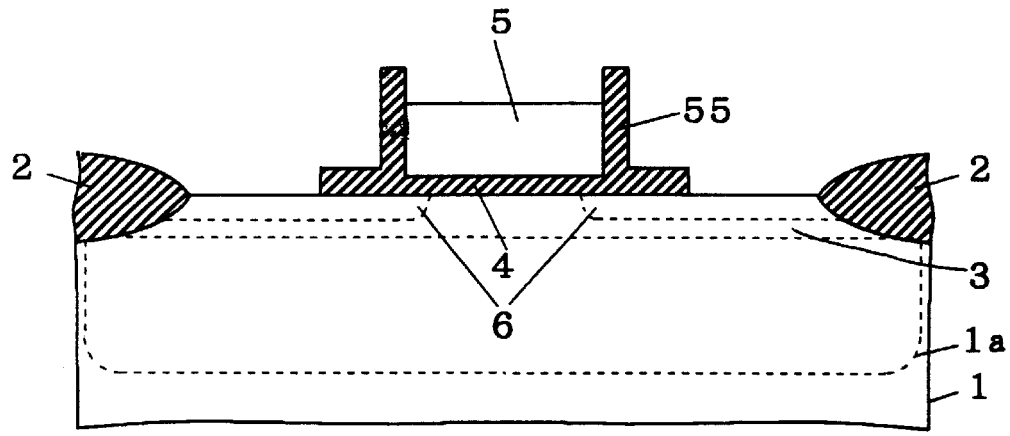

Then, silicon nitride is isotropically etched by hot phosphoric acid 53, as shown in FIG. 40. The cap layer 40 provided on the gate electrode 5 and the second insulating films 52 are removed by this etching. Thus formed are side walls 55 having L-shaped sections which are higher than the gate electrode 5, as shown in FIG. 41.

Figure 42:
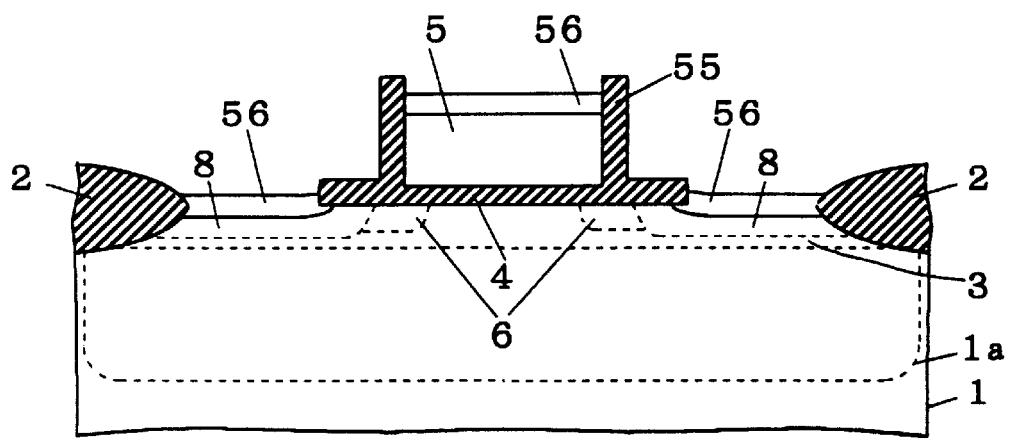
Figure 43:
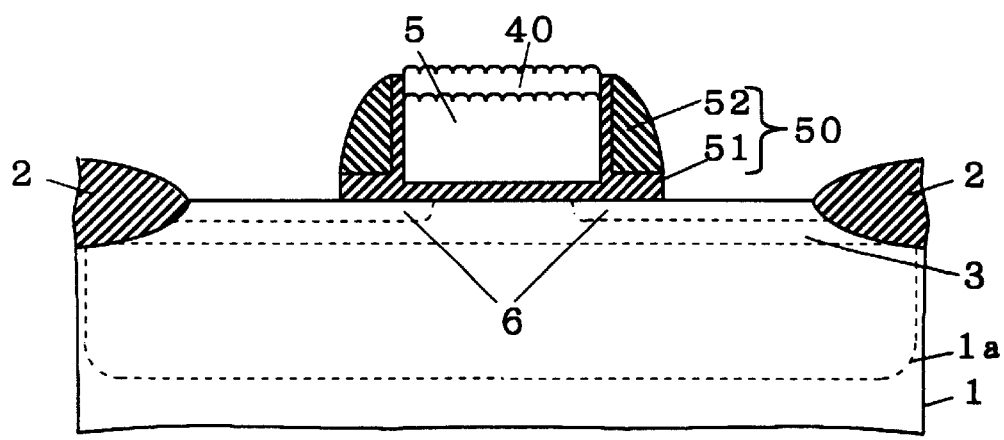
FIG. 43–FIG. 46 are sectional views showing steps of fabricating a second MOS transistor according to an embodiment 7 of the present invention.
Figure 44:
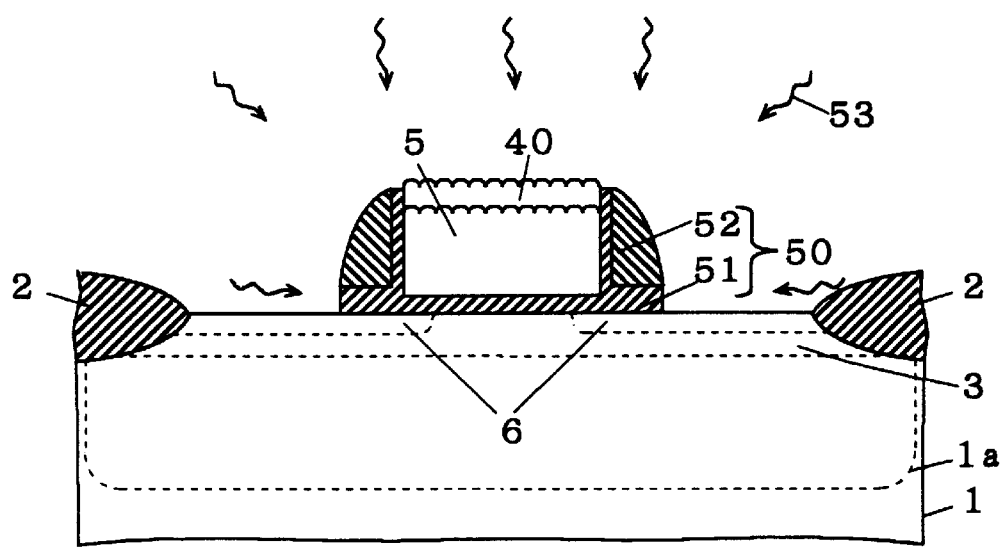
Figure 45:
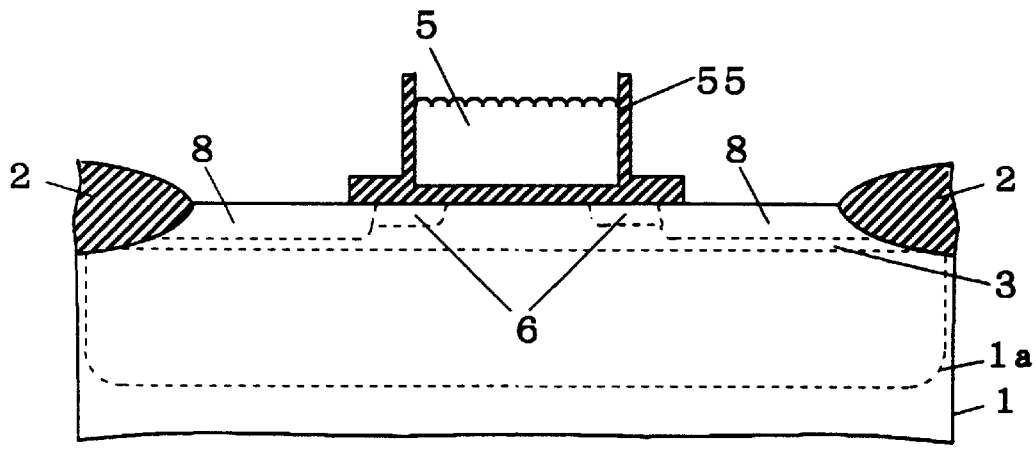
Figure 46:
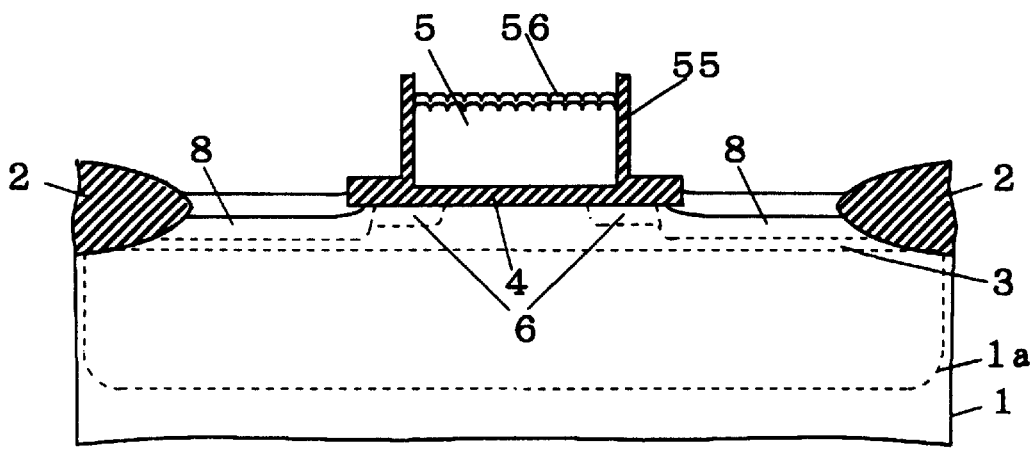
Figure 47:
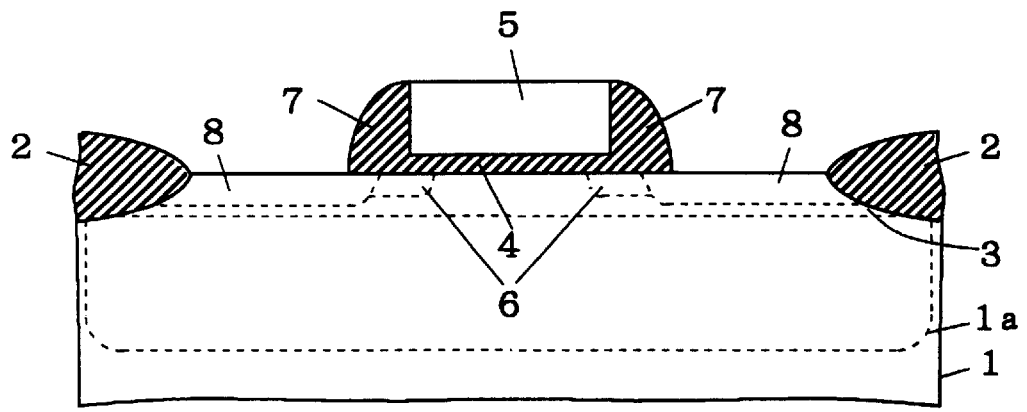
FIG. 47–FIG. 50 are sectional views showing steps of fabricating a conventional MOS transistor.
Figure 48:
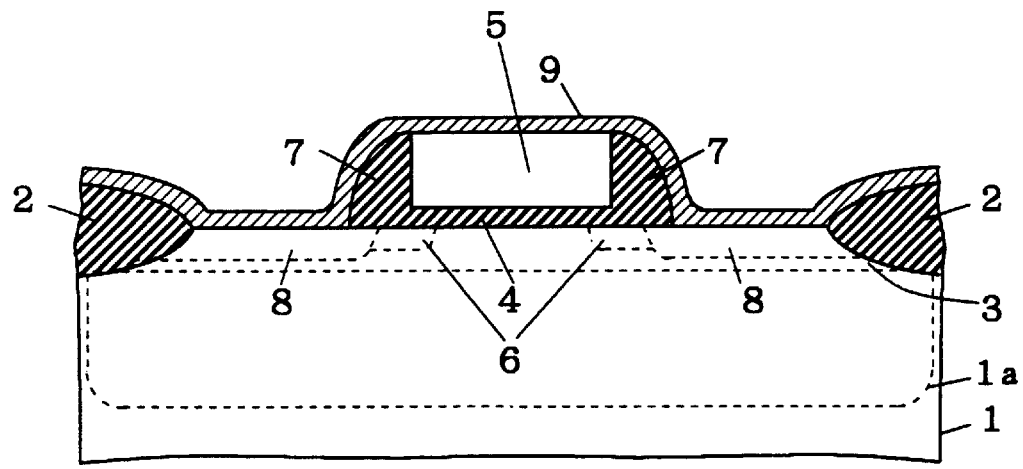
Figure 49:
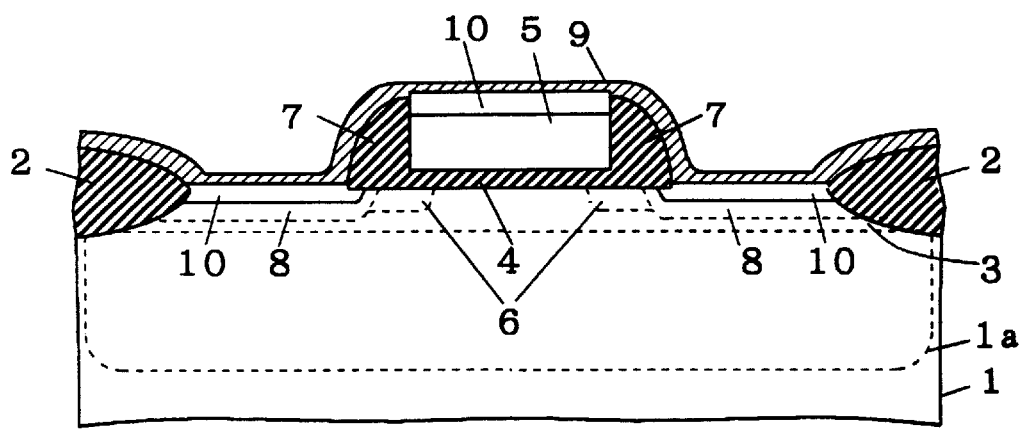
Figure 50:
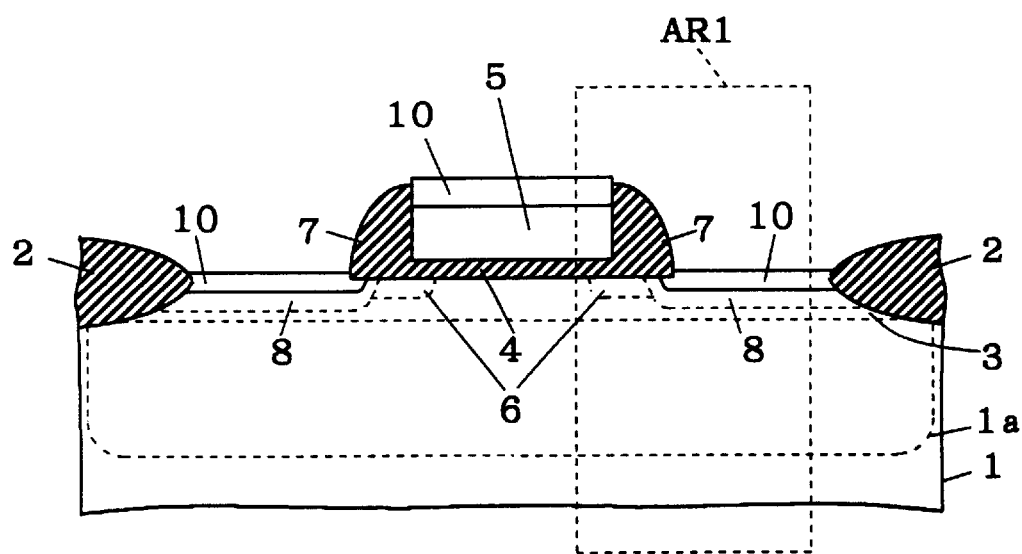
Figure 51:
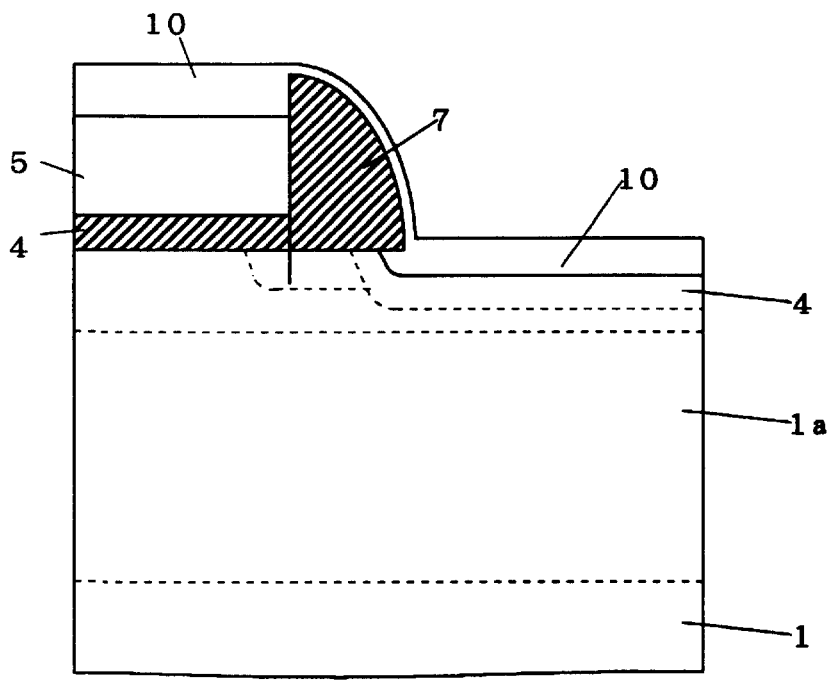
FIG. 51 is a sectional view showing a part of FIG. 50 in an enlarged manner.

Then, high-concentration source/drain layers 8 are formed through the side walls 55 serving as masks, and thereafter silicide films 56 are formed on surfaces of the gate electrode 5 and the high-concentration source/drains 8 respectively through a conventional salicide step. FIG. 42 shows a sectional shape of the silicon substrate 1 after formation of the silicide films 56.

In the fabrication steps for the MOS transistor according to the embodiment 7 of the present invention, the side walls 55 having L-shaped sections which are higher than the gate electrode 5 are formed before the salicide step, whereby the surface distances of the side walls 55 between the gate electrode 5 and the high-concentration source/drain layers 8 are longer as compared with the side walls of the MOS transistor according to the aforementioned respective embodiments, and hence short-circuiting hardly takes place across the gate electrode 5 and the high-concentration source/drain layers 8.

In the embodiment 7 of the present invention, a step of roughening the surface of the gate electrode 5 can be added for forming a MOS transistor provided with high side walls having L-shaped sections and the roughened gate electrode 5. In this case, a silicon substrate 1 having a roughened polycrystalline silicon film 31 shown in FIG. 10 is prepared, so that the fabrication method of the embodiment 7 is thereafter applied. In this case, sectional shapes shown in FIGS. 43 to 46, for example, appear in the respective steps shown in FIGS. 39 to 42 in relation to the embodiment 7. Also in this case, an effect of reducing gate resistance is attained by simplification of phase transition of silicon. Thus, the MOS transistor obtained by roughening the surface of the gate electrode 5 in the embodiment 7 is suitable for refinement as compared with the MOS transistor having the unroughened gate electrode 5, similarly to that the MOS transistor according to the embodiment 6 is suitable for refinement as compared with that according to the embodiment 5.

While crystal growth is employed for roughening in each of the aforementioned embodiments, heterogeneous corrosion such as wet treatment employing hot phosphoric acid, for example, may alternatively be employed for the roughening. In this case, polycrystalline silicon is subjected to roughening by hot phosphoric acid under such conditions that silicon is dissolved in the hot phosphoric acid in a concentration not more than a saturation concentration, the temperature is 130 to 160° C., and about 70 to 90% of hot phosphoric acid is employed.

While the structure according to the present invention is provided on both sides of the side walls in each of the aforementioned embodiments, the effect of the present invention can be attained also when the inventive structure is provided only on either one of the side walls, as a matter of course.

While the invention has been shown and described in detail, the foregoing description is in all aspects illustrative and not restrictive. It is therefore understood that numerous modifications and variations can be devised without departing, from the scope of the invention.

We claim:

1. MIS transistor including:
    a gate electrode being formed to be opposed to a silicon substrate through a gate insulating film; and
    side walls being formed on said silicon substrate on both sides of said gate electrode and having grooves being adjacent to said gate electrode,
    silicide films formed on said gate electrode and to extend into said grooves, said side walls and said grooves stopping the silicide films in said grooves to prevent creeping of the silicide films along side surfaces of said side walls;
    wherein said side walls having cavities unfilled with said silicide films and exposing a source/drain layer formed on said silicon substrate, wherein a surface of the source/drain layer is silicified.

2. The MIS transistor in accordance with claim 1, wherein a surface of said gate electrode is roughened.

3. MIS transistor including:

a gate electrode being formed to be opposed to a silicon substrate through a gate insulating film and having a silicified upper portion; and side walls being formed on said silicon substrate on both sides of said gate electrode and having grooves being adjacent to said gate electrode, said gate electrode being silicified with silicide films up to side surfaces of said gate electrode in said grooves to prevent creeping of the silicide films along side surfaces of said side walls;

wherein said side walls have cavities unfilled with said suicide films and exposing a source/drain layer formed on said silicon substrate, wherein a surface of the source/drain layer is silicified.

4. The MIS transistor in accordance with claim 3, wherein a surface of said gate electrode is roughened.

* * * * *